United States Patent
Akagawa et al.

(10) Patent No.: US 6,977,442 B2
(45) Date of Patent: Dec. 20, 2005

(54) SEMICONDUCTOR DEVICE STRUCTURE

(75) Inventors: Masafumi Akagawa, Kashihara (JP); Masahiro Horio, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 56 days.

(21) Appl. No.: 10/705,306

(22) Filed: Nov. 12, 2003

(65) Prior Publication Data

US 2004/0256723 A1  Dec. 23, 2004

(30) Foreign Application Priority Data

Nov. 15, 2002 (JP) .............................. 2002-332808
May 28, 2003 (JP) .............................. 2003-151278

(51) Int. Cl.$^7$ ............................................. H01L 23/48
(52) U.S. Cl. ....................... 257/780; 257/786; 257/789
(58) Field of Search ............................. 257/780–786, 257/789; 438/612, 613, 614–618, 619, 620

(56) References Cited

U.S. PATENT DOCUMENTS 5,565,378 A * 10/1996 Harada et al. .............. 438/106
5,989,991 A * 11/1999 Lien ........................... 438/612
6,538,326 B2    3/2003 Shimizu et al.

* cited by examiner

Primary Examiner—Carl Whitehead, Jr.
Assistant Examiner—Yennhu B. Huynh
(74) Attorney, Agent, or Firm—Nixon & Vanderhye P.C.

(57) ABSTRACT

A semiconductor device includes a conductive layer with a plurality of wires, and a bonding pad formed in a region overlapping with the plurality of wires of the conductive layer. One of the wires is connected to the bonding pad, and an insulating protective film is formed between the remaining wires and the bonding pad. The protective film is bridged between adjacent wires at least in a region overlapping with the bonding pad. As a result, the protective film on the wires forms a bridge structure, which is effective in preventing cracking at a lower portion of the protective film. Further, a void formed underneath the bridged portion serves as an air spring to prevent damage to the structural elements, such as the wires, formed under the protective film. Further, because a polyimide film, which serves as a shock absorber, is not required, working efficiency can be improved and chip cost can be reduced.

11 Claims, 30 Drawing Sheets

THICKNESS OF PROTECTIVE LAYER : t=1.2 μm

| S1 \ L1 | 400 | 900 | 1400 | 1900 |
|---|---|---|---|---|
| 0.8 | ○ | △ | × | × |
| 1.2 | ○ | △ | △ | × |
| 1.5 | ○ | △ | △ | × |
| 1.8 | ○ | ○ | ○ | ○ |

| | SCATTERING OF RESIST MATERIAL | SWELLING OF PHOTORESIST LAYER |
|---|---|---|
| ○ | ABSENT | ABSENT |
| △ | ABSENT | PRESENT |
| × | PRESENT | PRESENT | ns
SEMICONDUCTOR DEVICE STRUCTURE

FIELD OF THE INVENTION

The present invention relates to a semiconductor device for use in semiconductor integrated circuits, and to a fabrication process of such a semiconductor device. More specifically, the invention relates to a structure between a plurality of thin wires on a substrate and a bonding pad formed on these wires.

BACKGROUND OF THE INVENTION

In response to the recent advancement in electronic devices achieving improved functionality and performance, semiconductor integrated circuits mounted in such electronic devices have an increased complexity of integration (the number of semiconductor elements integrated on one chip) and an increased chip size. In order to avoid such increase in chip size, there is a need for micro-fabrication (reduction in design rule) of the semiconductor integrated circuits.

A semiconductor integrated circuit chip can be divided into two major regions: an operational region (also known as an active region) inside the chip; and a bonding pad region on a chip surface. The operational region includes a region (active region) where semiconductor elements such as transistors are formed, and a metal wiring region (wiring region) that connects the semiconductor elements together. The bonding pad region is a region where a bonding pad is formed. The bonding pad is an electrode for making electrical connections with outside, for example, by wire bonding using thin gold leads, so that signals can be sent in and out of the semiconductor integrated circuit.

As the semiconductor elements become denser and more highly integrated, the metal pattern connecting these elements has become complex, and it is now common practice to employ a multi-layer wiring structure in which a plurality of wiring layers are laminated via interlayer insulating films. As a result, a liquid crystal driver LSI, for example, now has 500 to 1000 terminals for making connections with external terminals. This has increased the area of the bonding pad other than the operational region (active region), and brought a proportional increase in the size of the semiconductor integrated circuit. This is a setback in realizing lighter, thinner, and smaller electronic devices, such as cellular phones and PDA (Personal Digital Assistant).

One conventional method of reducing the chip size is to form the bonding pad in an active region of a semiconductor substrate. This method is known as the "area pad" method. The following describes conventional techniques concerning the area pad method.

FIG. 26 illustrates one example of the area pad method for a semiconductor device of a bi-layer wiring structure, disclosed in Japanese Publication for Unexamined Patent Application No. 2002-198374 (Tokukai 2002-198374; Published on Jul. 12, 2002). In the semiconductor device shown in FIG. 26, a first wiring layer 2 is connected to an active region of a silicon substrate 1, a second wiring layer 7 is formed on the first wiring layer 2 via an interlayer insulating film 6, and a bonding pad 14 is disposed over the second wiring layer 7 via a protective film 8 and a polyimide film 10, covering the active region of the silicon substrate 1.

In an area covered with the bonding pad 14, the second wiring layer 7 has a plurality of wires 7a and 7b. The bonding pad 14 is bonded to a wire 7a of the second wiring layer 7 through openings 9 and 11 of the protective film 8 and the polyimide film 10. Between the bonding pad 14 and the wires 7b are interposed the protective film 8 and the polyimide film 10.

With the semiconductor device of the foregoing structure, the fabrication steps can be simplified and the size of the device can be reduced at the same time. In addition, the foregoing structure offers more flexibility in terms of positioning of the bonding pad and wire connections between the bonding pad and the semiconductor elements.

Referring to FIG. 26 through FIG. 34, a fabrication process of the semiconductor device is described below. First, as shown in FIG. 27, an element 20, such as a MOS (Metal Oxide Semiconductor) transistor, is formed on a main surface (simply "surface" hereinafter) of the silicon (Si) substrate 1 according to common fabrication procedures of semiconductor integrated circuits.

Then, using a CVD (Chemical Vapor Deposition) method, an insulating film 25 is deposited to a predetermined thickness over the entire surface of the silicon substrate 1. As a result, the insulating film 25 covers the active region. Thereafter, contact holes are formed through predetermined positions of the insulating film 25. The contact holes are formed according to common fabrication steps of a semiconductor integrated circuit, including, for example, a photolithography step, and an etching step for the insulating film.

Next, the first wiring layer 2, which is a first layer of wiring, is deposited over the entire surface, including the insulating film 25 and the openings. The first wiring layer 2 may be a single-layer metal thin film, or a laminate of metal. Alternatively, the first wiring film 2 may be a laminate of a semiconductor thin film and metal, wherein a material with a small resistivity is used for the laminate. In this conventional technique, a laminate of a TiW thin film of about 310 nm thick and an AlSi thin film of about 600 nm thick is used. The first wiring layer 2 is then processed into a predetermined shape to form wires 2a and 2b, which make up the first layer of wiring. As a result, wiring is made between each element and electrodes and between the elements as well.

Thereafter, as shown in FIG. 28, the first interlayer insulating film 6 is formed over the entire surface, including the first wiring layer 2. The first interlayer insulating layer 6 may be a single-layer insulating film, or more preferably a laminate of multiple insulating films to planarize irregularities of the wirings 2a and 2b making up the first wiring layer 2. In this conventional technique, the first interlayer insulating film 6 is formed by the following sequence of steps. First, a $SiO_x$ film 3 of about 500 nm thick is formed over the entire surface, including the first wiring layer 2, using a plasma CVD method. Then, an SOG (Spin on Glass) film 4 is formed in recessed portions of the $SiO_x$ film 3, using an SOG film/etch back process. Finally, a $SiO_x$ film 5 of about 450 nm thick is formed over the $SiO_x$ film 3 and the SOG film 4, using a CVD method.

The SOG film 4, also known as a coated silicon oxide film, is a silicon oxide film formed by a coating method (SOG). The SOG film 4 is highly effective to achieve planarization because it can be formed by simple spin coating (coating method), and because it forms in recessed portions, rather than raised portions, of the coated surface due to the surface tension. However, using the SOG film 4 alone as the first interlayer insulating film 6 is not preferable because a trace amount of water or other components contained in the SOG film 4 seeps out and reacts with the material of the metal wiring, causing a problem of disconnected wires in the metal wiring.

In order to avoid such a problem, the entire surface of the SOG film 4 is etched by a technique known as an etch back process after forming the SOG film over the entire surface of the $SiO_x$ film 3. As a result, the SOG film 4 remains only in the recessed portions of the $SiO_x$ film 3, planarizing the surface. Then, the $SiO_x$ film 5 is formed over the planarized surface by a CVD method. In this manner, the SOG film 4 is sandwiched between the $SiO_x$ film 3 and the $SiO_x$ film 5, thereby preventing water or other components from seeping out of the SOG film 4.

Thereafter, as shown in FIG. 29, an opening (via hole) 6a is formed through a predetermined portion of the first interlayer insulating film 6. One function of the opening 6a is to connect the wires of the first wiring layer 2 to one another. The opening 6a is formed by first etching the insulating film isotropically to provide a predetermined slant at a stepped portion, followed by anisotropic etching of the insulating film.

Thereafter, as shown in FIG. 30, the second wiring layer 7 is formed by depositing a conductive material on the first interlayer insulating film 6 and in the opening 6a. The second wiring layer 7 is then patterned into a predetermined wiring pattern to form second wires 7a through 7c. In this conventional technique, the second wiring layer 7 is a laminate of a TiW film of about 150 nm thick and an AlSi film of about 1100 nm thick, for example.

Then, as shown in FIG. 31, the protective film 8 is formed over the second wiring layer 7. The protective film 8 is provided to protect the surface of the semiconductor integrated circuit, and to insulate an area pad of an Au bump from the second wires 7a through 7c of the second wiring layer 7. As the protective film 8, a laminate of a $SiO_x$ film and a SiN film, both of which are formed by a plasma CVD method, is used.

Thereafter, as shown in FIG. 32, an opening 9 is formed at a predetermined position of the protective film 8. The opening 9 is provided to provide external electrical connections for the first wires 2a and 2b and the second wires 7a and 7b.

Next, as shown in FIG. 33, the polyimide film 10 is applied and deposited on the protective film 8 and in the opening 9. The polyimide film 10 is provided as a film (shock absorber film) for absorbing the stress generated when the chip formed with the area pad is bonded to the substrate.

Thereafter, as shown in FIG. 34, an opening 11 is formed at a predetermined position of the polyimide film 10. The opening 11 is formed in such a manner that only the wire 7a is exposed among the plurality of wires 7a and 7b of the second wiring layer 7 covered with the protective film 8. Here, the inner wall of the opening 11 is slanted in the form of a bird's beak by isotropic etching, as shown in FIG. 34.

The opening is positioned and sized such that the opening includes and is larger than the area of the opening through the protective film, and that the opening is sufficiently smaller than the size of the Au bump 13, i.e., the size of the area pad, formed above. In the area pad of the conventional technique, the opening measures about 10 $\mu$m×10 $\mu$m, because the shock absorber is required above the second wires 7a and 7b of the second wiring layer 7 beneath the area pad.

Then, as shown in FIG. 26, the bonding pad 14, including the barrier metal 12 and the Au bump 13, is formed over the openings 9 and 17 of the protective film 8 and the insulating film 15, and over the plurality of wires 7a and 7b of the second wiring layer 7 covered with the protective film 8.

More specifically, first, a thin film of metal and a thin film of gold (Au), which together make up the barrier metal 12, are deposited. The barrier metal 12 is provided to prevent a chief metal of the area pad, for example, such as gold (Au), from reacting with the material of the conductive layer constituting the wires. The barrier metal 12 also serves as an electrode when forming the area pad by plating.

Thereafter, using the barrier metal 12 as an electrode, the Au bump 13, having a predetermined thickness, is formed in a predetermined position, i.e., the area pad is formed. The Au bump 13 is sized to have larger dimensions than the opening 11 through the polyimide film 10. Then, using the Au bump 13 as a mask, unnecessary portions of the barrier metal 12 are removed to form the bonding pad 14.

In the conventional technique, the barrier metal 12 is formed by depositing a TiW thin film of 250 nm thick and a Au thin film of 170 nm thick. Then, using the thin film of the barrier metal 12 as an electrode, gold (Au) is plated to a thickness of about 10 $\mu$m, thereby forming a Au bump 13 (area pad) that measures approximately 35 $\mu$m×50 $\mu$m.

In the semiconductor device of a bi-layer wiring structure disclosed in the foregoing publication Tokukai 2002-198374, at least two steps are required to form the polyimide film 10: a step of applying and depositing polyimide in a portion where the bonding pad 14 is to be formed; and a step of forming an opening through a predetermined portion of the polyimide film 10 to provide the opening 11. As a result, additional steps of photolithography and etching are required, resulting in poor working efficiency and increased chip cost.

Omitting the polyimide film 10 to avoid this problem may damage the structural elements underneath the bonding pad 14 by the stress exerted during mounting such as COF (Chip on Film), because in this case no shock absorber is provided.

The foregoing publication Tokukai 2002-198374 also discloses a structure in which the protective film 8 has overhung protrusions, as shown in FIG. 35 and FIG. 36, so that the interface of the protective film 8 and the polyimide film 19 has improved adhesion. As the term is used herein, "overhung" is an upper portion of the protective film 8 extending outward from the base portion. Specifically, as illustrated in FIG. 36, the overhung portion is a portion defined by X>Y, where X is the maximum outer dimension of a protrusion 8b along a direction parallel to the substrate surface (direction orthogonal to the wire 7b in the example of FIG. 36), and Y is a dimension of the lowest portion of the protrusion 8b along this direction.

This enables the polyimide film 10 to be deposited also on pinched portions 8a of the overhung protrusion 8b, allowing the protrusions 8b of the protective film 8 to hook the polyimide film 10 at the pinched portions 8a. As a result, the protective film 8 and the polyimide film 10 can have improved adhesion.

However, owning to the fact that the thickness of the overhung protrusion 8b is thin at the pinched portions 8a, a crack 27 was observed at a plurality of pinched portions 8a of the protective film 8, as shown in FIG. 36 and FIG. 37, when stress was applied during mounting such as COF after forming the Au bump 13 in the semiconductor integrated circuit.

Here, water may seep into a circuit structure, such as the second wire 7b, through the crack 27. In this case, if current flows into the portion soaked with water, the metal wiring is corroded, leading to disconnection of the wires over time.

SUMMARY OF THE INVENTION

The present invention was made in view of the foregoing problems, and it is an object of the present invention to provide a semiconductor device that can prevent damage caused by applied stress, without lowering working efficiency or increasing chip cost, and to provide a fabrication process of such a semiconductor device.

In order to achieve the foregoing object, the present invention provides a semiconductor device including: a conductive layer with a plurality of wires; and a bonding pad formed in a region overlapping with the plurality of wires of the conductive layer, wherein one of the plurality of wires is connected to the bonding pad, and a protective film with an insulating property is formed between remaining ones of the plurality of wires and the bonding pad, and wherein the protective film formed on the remaining ones of the plurality of wires is bridged between adjacent ones of the remaining ones of the plurality of wires at least in a region overlapping with the bonding pad.

With this structure, the protective film forms a bridge between adjacent wires so that the protective film on the wires does not have a conventional overhung structure but has a bridge structure. When the protective film has an overhung structure, the protective film deforms sideways when it is subjected to downward pressure. The applied stress concentrates on pinched portions at a lower portion of the protective film, causing a crack therein.

On the other hand, with the bridge structure, the protective film does not easily deform sideways in response to applied downward pressure, because the protective film is bridged between adjacent wires. Thus, with the bridge structure, cracking is prevented at a lower portion of the protective film.

Further, because the protective film is bridged between adjacent wires, a void is formed underneath the bridged portion. The void serves as an air spring (shock absorber) when stress is exerted on the protective film through the bonding pad in mounting the semiconductor circuit on a substrate, thereby preventing damage to the structural elements, such as wires, formed under the protective film.

Further, because the polyimide film, which has been conventionally used as a shock absorber, is not required, working efficiency can be improved and chip cost can be reduced.

Note that, so long as the foregoing effects are obtained, the protective film on the wires needs to be bridged only partially, not entirely.

It should be noted that, after forming the protective film, photolithography is often used in the subsequent step of forming an opening for bonding the wire with the bonding pad, or the step of forming a bonding pad. In this case, when the void is in communication with outside, a resist material may enter the void, and in a subsequent heat treatment process, may scatter out of the void. In other cases, air vesicles may spout out of the void. This is detrimental to the fabrication of the semiconductor device.

In contrast, with the foregoing structure, the insulating film is formed over the protective film to block the communication between the void and outside. As a result, the adverse effect on the fabrication of the semiconductor device is prevented.

However, after a series of experiments, the inventors of the present invention have found that scattering of a resist material or spouting of air vesicles does not occur under certain conditions, even when the void is in communication with outside.

Thus, the semiconductor device of the present invention according to the foregoing structure is adapted so that, in a region where the protective film is bridged, a minimum value S1 of wire distance between adjacent wires, and/or a length L1 of a bridged portion of the protective film are adjusted to suppress scattering and spouting at a void formed by the bridging of the protective film.

With this structure, scattering of a resist material or spouting of air vesicles is suppressed even when the void is in communication with outside, thereby suppressing the adverse effect on the fabrication of the semiconductor device.

Note that, the semiconductor device of the foregoing structure is most effective when used as a semiconductor device of an area pad structure, i.e., a semiconductor device in which the conductive layer is a second wiring layer that is formed on a semiconductor substrate having an active region where a semiconductor element is formed, and on a first wiring layer, via an interlayer insulating film, that is electrically connected to the active region, and in which the bonding pad is formed to overlap at least partially with the active region.

A fabrication process of a semiconductor device according to the present invention includes the steps of: forming a conductive layer on a substrate; forming an insulating film on the conductive layer; forming an opening through the insulating film; and forming a metal film on the insulating film and in the opening, so as to form a bonding pad, wherein: the step of forming a conductive layer include a step of forming a plurality of wires; the step of forming an insulating film on a conductive layer includes a step of forming a protective film having an insulating property; and in the step of forming a protective film, the protective film is formed so that the protective film is bridged between adjacent ones of the wires at least in a region overlapping with the bonding pad.

The protective film can be bridged between adjacent wires by suitably adjusting the distance between the wires, and the thickness of the protective film.

With this process, the protective film of a bridged structure can be formed in the step of forming the protective film. This prevents cracking at a lower portion of the protective film. Further, a void formed underneath the bridged portion serves as an air spring to prevent damage to the structural elements, such as the wires, formed under the protective film. Moreover, because the step of forming a polyimide film as a shock absorber on the protective film is not required, working efficiency can be improved and chip cost can be reduced.

Note that, so long as the foregoing effects are obtained, the protective film on the wires needs to be bridged only partially, not entirely.

The fabrication process of a semiconductor device of the present invention, according to the foregoing process, is adapted so that, in the step of forming a plurality of wires, the wires are formed by adjusting a minimum value S1 of wire distance of adjacent ones of the wires in a region where the protective film is bridged, and/or, in the step of forming a protective film, the protective film is formed by adjusting a length L1 of the bridged portion, so as to suppress scattering and spouting at a void formed by the bridging of the protective film.

With this process, by adjusting the minimum value S1 of wire distance, and/or the length L1 of the bridged portion, scattering and spouting at the void can be suppressed even when the void is in communication with outside, thereby suppressing the adverse effect on the fabrication of the semiconductor device.

The fabrication process of a semiconductor device is most effective when it is used for a semiconductor device of an area pad structure, i.e., a semiconductor device in which the conductive layer is a second wiring layer that is formed on a semiconductor substrate having an active region where a semiconductor element is formed, and on a first wiring layer, via an interlayer insulating film, that is electrically connected to the active region, and in which the bonding pad is formed to overlap at least partially with the active region.

For a fuller understanding of the nature and advantages of the invention, reference should be made to the ensuing detailed description taken in conjunction with the accompanying drawings.

BRIEF DESCRIPTION OF THE DRAWINGS

FIG. 13(*b*) is a cross sectional view showing how the protective film is formed on the wires illustrated in FIG. 12, taken along the line B–B' of FIG. 12.

FIG. 16(*b*) is a cross sectional view schematically showing the semiconductor integrated circuit, taken along the line C–C' of FIG. 16(*a*).

DESCRIPTION OF THE INVENTION

[First Embodiment]

Figure 1:
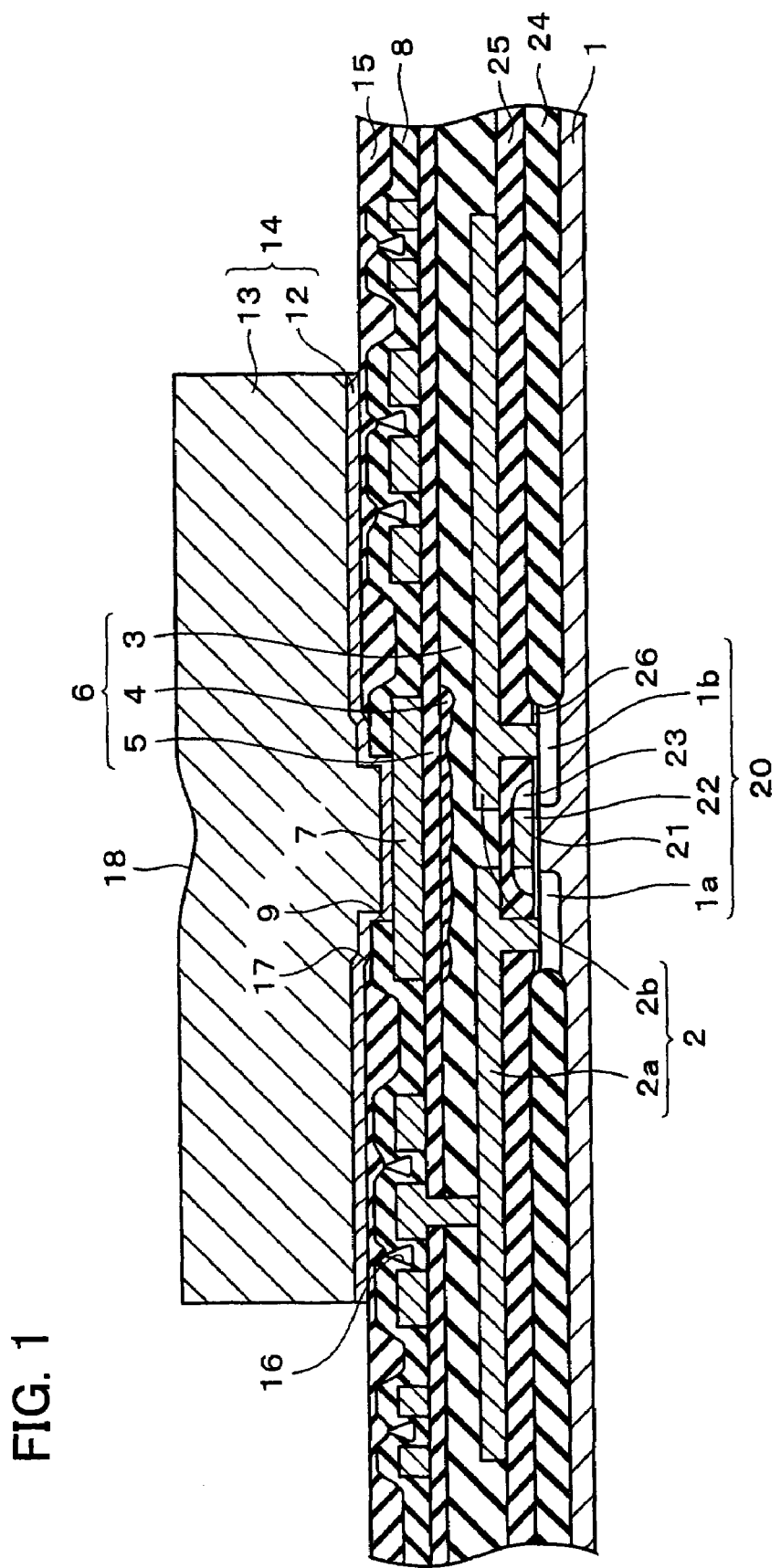
FIG. 1 is a cross sectional view schematically showing a structure of a semiconductor integrated circuit in a semiconductor device of one embodiment of the present invention.

The following describes one embodiment of the present invention with reference to FIG. 1 through FIG. 11. It should be noted that structures similar to those already described in connection with the BACKGROUND OF THE INVENTION section will be indicated by the same reference numerals.

In the following, detailed description of one embodiment of a semiconductor device of the present invention is made as to a semiconductor integrated circuit having MOS transistors formed on a silicon (Si) substrate. In the present invention, the semiconductor material used for the semiconductor substrate, and the type and combination of semiconductor elements formed on the semiconductor substrate are not particularly limited. Further, as the term is used herein, "active region" is a region on the semiconductor substrate where semiconductor elements are formed.

FIG. 1 is a cross sectional view schematically illustrating a portion of the semiconductor integrated circuit for a single semiconductor element in one embodiment of the semiconductor device according to the present invention. Note that, in the following, the semiconductor integrated circuit will be described in regard to a portion corresponding to a single semiconductor element.

As illustrated in FIG. 1, the semiconductor integrated circuit of the present embodiment includes a silicon substrate (semiconductor substrate) 1, a first wiring layer 2, a second wiring layer 7, and a bonding pad 14. The silicon substrate 1 has an active region in which a semiconductor element 20 is formed. The first wiring layer 2 is formed on the silicon substrate 1, and is electrically connected to the active region. The second wiring layer 7 is formed on the first wiring layer 2 via an interlayer insulating film 6. The bonding pad 14 is formed in an area that at least partially covers the active region (above the active region), and is provided for making external electrical connections.

In the present embodiment, the semiconductor element 20 is a MOS transistor. The semiconductor element 20 includes: an impurity diffusing layer 1a and an impurity diffusing layer 1b, provided on an upper surface of the silicon substrate 1, that function as a source region and a drain region, respectively; oxide films (films for preventing damage caused when ions are implanted into the source and drain regions) 26 formed on the impurity diffusing layers 1a and 1b; a gate insulating film 21 formed on the silicon substrate 1; a polysilicon gate electrode 22; and a side-wall protective film 23 formed on side surfaces of the polysilicon gate electrode 22.

In the semiconductor element 20 having the foregoing structure, a region between the impurity diffusing regions 1a and 1b of the silicon substrate 1 serves as a channel region. Thus, in the silicon substrate 1 of the present embodiment, the impurity diffusing layers 1a and 1b and the channel region therebetween make up an active region. A portion of the silicon substrate 1 where the semiconductor element 20 (active region) is not formed is an element-isolating region where element-isolating insulating films 24 are formed to electrically isolate the semiconductor element 20 from other semiconductor elements.

In the silicon substrate 1, an insulating film 25 of a predetermined thickness is formed on the semiconductor element 20 in the active region, and on the element-isolating insulating films 24 formed in the element-isolating region. Through predetermined portions of the insulating film 25 (portions corresponding to the impurity diffusing layers 1a and 1b), contact holes are formed to provide electrical connections between the first wiring layer 2 and the impurity diffusing layers 1a and 1b.

The first wiring layer 2 is a single-layer or bi-layer conductive film made of a conductor such as aluminum. The first wiring layer 2 includes a plurality of wires 2a and 2b formed on the insulating film 25. The wire 2a is electrically connected to the impurity diffusing layer 1a through the contact hole, and the wire 2b is electrically connected to the impurity diffusing layer 1b through the contact hole.

On the first wiring layer 2 is the interlayer insulating film 6, which is a single-layer or bi-layer insulating film for insulating the first wiring layer 2 and the second wiring layer 7 from each other. Through the interlayer insulating film 6, via holes are formed to electrically connect the first wiring layer 2 and the second wiring layer 7 to each other.

The interlayer insulating film 6 has a surface planarizing function. The interlayer insulating film 6 may be a single-layer film or a multi-layer film. In the present embodiment, a laminate of multiple insulating films is used for the interlayer insulating film 6, because it has the advantage of planarizing an irregular surface of the first wiring layer 2 made from a first conductive film.

Like the first wiring layer 2, the second wiring layer 7 is also a single-layer or multi-layer film of a conductor such as aluminum. The second wiring layer 7 includes a plurality of second wires 7 in an area covered by the bonding pad 14 (below the bonding pad 14), the second wires 7 being insulated from one another. The second wiring layer 7 is partially connected to the first wiring layer 2 through the via holes of the interlayer insulating film 6.

Figure 6:
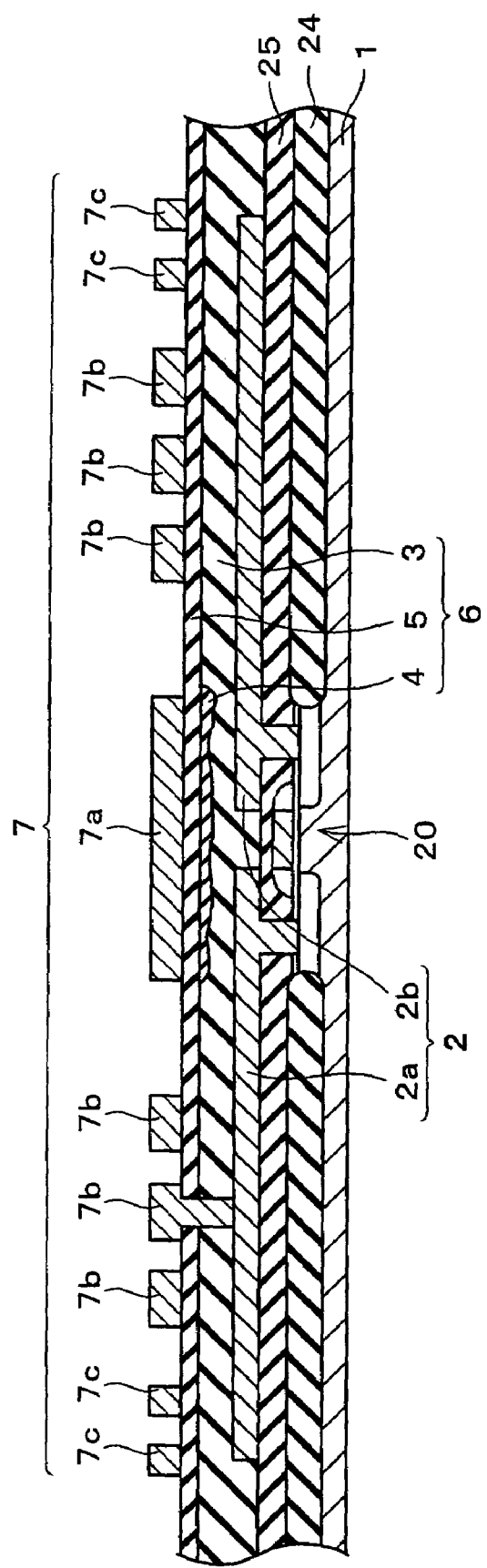
FIG. 6 is a cross sectional view explaining the fabrication process of the semiconductor integrated circuit, schematically showing a state after a second wiring layer forming step.

In the description of the present invention, where necessary, the second wires are distinguished from one another, as shown in FIG. 6, by assigning reference numeral 7a for the second wires connected to the bonding pad 14, reference number 7b for the second wires not connected to the bonding pad 14 but are formed in an area covered by the bonding pad 14, and reference number 7c for all the other wires.

The structure described so far is the same as the structure of the semiconductor integrated circuit of the conventional semiconductor device described above.

Figure 2:
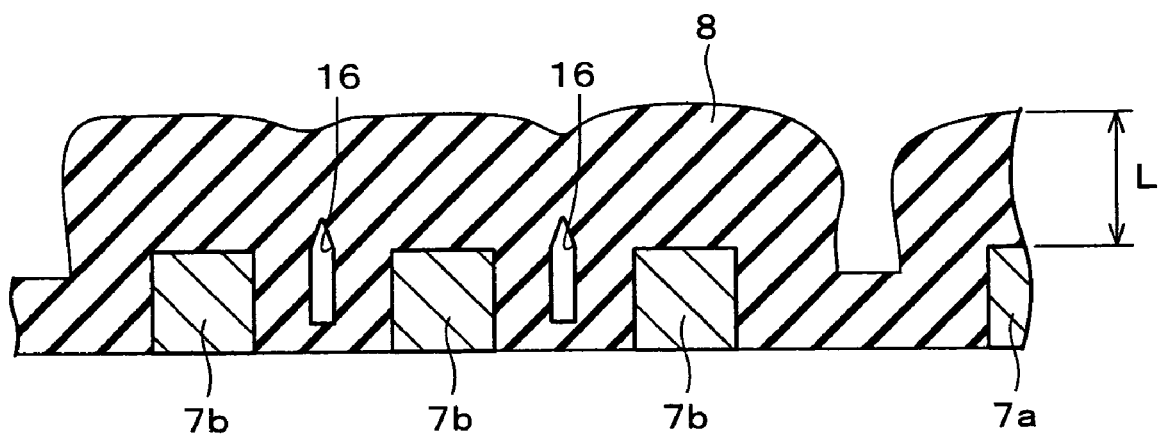
FIG. 2 is a cross sectional view of the semiconductor integrated circuit, showing how a protective film is formed on adjacent second wires.

On the second wiring layer 7 is formed a protective film 8. In the present embodiment, as shown in FIG. 2, the protective film 8 is formed so that it is bridged between adjacent ones of the second wires 7b. In this way, the material of the protective film 8 does not completely fill the gap between adjacent second wires 7b, and a void 16 is formed in a portion of the gap between the second wires 7.

The voids 16 serve as an air spring to absorb applied stress on the protective film 8 when mounting chips in COF mounting or other processes, thereby preventing damage to the semiconductor element 20, the first wiring layer 2, and the second wiring layer 7 underneath the protective film 8. Further, in the present embodiment, the polyimide film 10 does not need to be provided as a shock absorber, thereby improving working efficiency and reducing chip cost.

Further, in the present embodiment, the protective film 8 formed on the second wiring layer 7 does not have a conventional overhung structure but has a bridge structure. In the overhung structure, applied downward pressure crushes and spreads the protective film 8 sideways, causing the bending angle at a recessed portion of the protective film 8 to be small and thus cracking the protective film 8. On the other hand, in the bridge structure, the protective film 8 does not easily spread sideways in response to applied downward pressure. Accordingly, the bending angle at a recessed portion of the protective film 8 remains large, and cracking is prevented.

Figure 3:
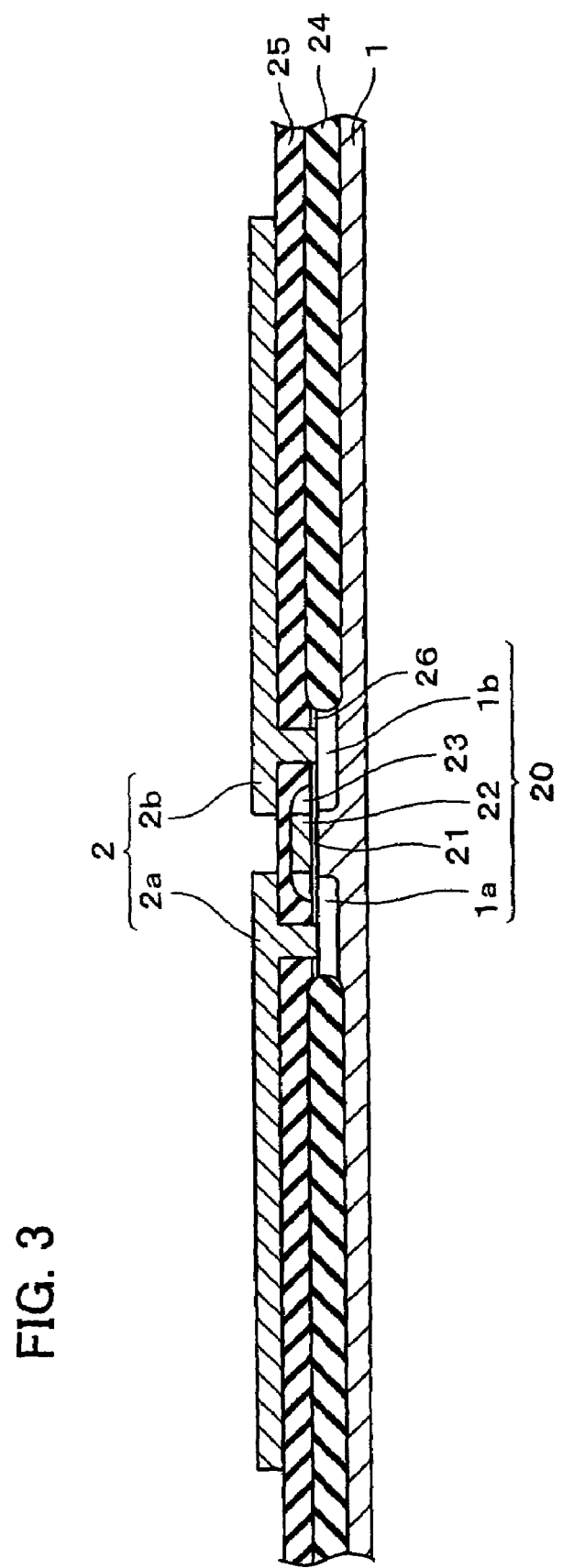
FIG. 3 is a cross sectional view explaining a fabrication process of the semiconductor integrated circuit, schematically showing a state after a first wiring layer forming step.

Referring to FIG. 3 through FIG. 10, a fabrication process of the semiconductor integrated circuit is described below. FIG. 3 through FIG. 10 illustrate fabrication steps of the semiconductor integrated circuit. First, as shown in FIG. 3, the semiconductor element 20, which is a MOS transistor in this embodiment, is formed on a main surface (simply "surface" hereinafter) of the silicon (Si) substrate 1 according to common fabrication procedures of semiconductor integrated circuits.

Then, using a CVD method, the insulating film 25 is deposited to a predetermined thickness over the entire surface of the silicon substrate 1. As a result, the insulating film 25 covers the active region. Thereafter, contact holes are formed through predetermined positions of the insulating film 25. The contact holes are formed according to common fabrication steps of a semiconductor integrated circuit, including, for example, a photolithography step and an etching step for the insulating film.

Next, the first wiring layer 2, which is a first layer of wiring, is deposited over the entire surface of the insulating film 25, including the openings, as shown in FIG. 3. The first wiring layer 2 may be a single-layer metal thin film, or a laminate of metal. Alternatively, the first wiring film 2 may be a laminate of a semiconductor thin film and metal, wherein a material with a small resistivity is used for the laminate. The present embodiment uses a laminate of a TiW thin film of about 310 nm thick and an AlSi thin film of about 600 nm thick. Then, the first wiring layer 2 is processed into a predetermined shape to form the wires 2a and 2b, which make up the first layer of wiring. As a result, wiring is made between each element and electrodes and between the elements as well.

Figure 4:
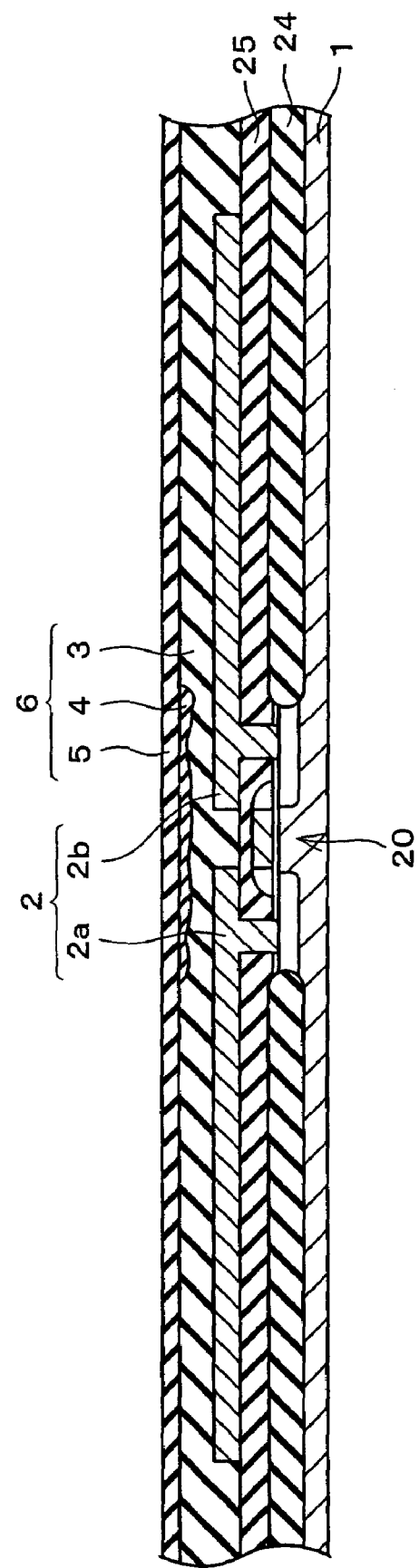
FIG. 4 is a cross sectional view explaining the fabrication process of the semiconductor integrated circuit, schematically showing a state after an interlayer insulating film forming step.

Thereafter, as shown in FIG. 4, the first interlayer insulating film 6 is formed over the entire substrate surface, including the first wiring layer 2. The first interlayer insulating layer 6 may be a single-layer insulating film, or more preferably a laminate of multiple insulating films to planarize the irregularities of the wirings 2a and 2b making up the first wiring layer 2. In the present embodiment, the first interlayer insulating film 6 is formed by the following sequence of steps. First, a $SiO_x$ film 3 of about 500 nm thick is formed over the entire substrate surface, including the first wiring layer 2, using a plasma CVD method. Then, an SOG film 4 is formed in recessed portions of the $SiO_x$ film 3, using an SOG film/etch back process. Finally, a $SiO_x$ film 5 of about 450 nm thick is formed over the $SiO_x$ film 3 and the SOG film 4, using a CVD method.

The SOG film 4 is a silicon oxide film, also known as a coated silicon oxide film, formed by a coating method (SOG: Spin on Glass). The SOG film 4 is highly effective to achieve planarization because it can be formed by simple spin coating (coating method), and because it forms in recessed portions, rather than raised portions, of the coated surface due to the surface tension. However, using the SOG film 4 alone as the first interlayer insulating film 6 is not preferable because a trace amount of water or other components contained in the SOG film 4 seeps out and reacts with the material of the metal wiring, causing a problem of disconnected wires in the metal wiring.

In order to avoid such a problem, the entire surface of the SOG film 4 is etched by a technique known as an etch back process after forming the SOG film 4 over the entire surface of the $SiO_x$ film 3. As a result, the SOG film 4 remains only in the recessed portions of the $SiO_x$ film 3, planarizing the surface. Then, the $SiO_x$ film 5 is formed over the planarized surface by a CVD method. In this manner, the SOG film 4 is sandwiched between the $SiO_x$ film 3 and the $SiO_x$ film 5, thereby preventing water or other components from seeping out of the SOG film 4.

Figure 5:
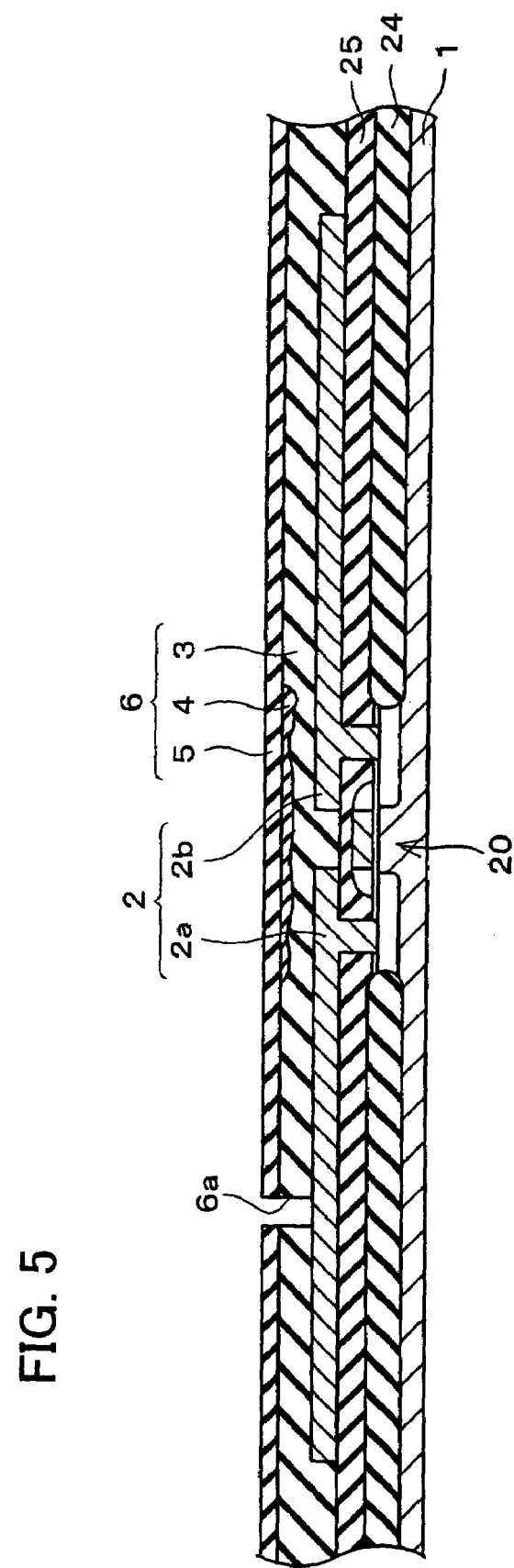
FIG. 5 is a cross sectional view explaining the fabrication process of the semiconductor integrated circuit, schematically showing a state after a step of forming an opening through the interlayer insulating film.

Thereafter, as shown in FIG. 5, an opening (via hole) 6a is formed through a predetermined portion of the first interlayer insulating film 6. The opening 6a is formed by a common photolithography process or a common insulating-film etching process. However, it should be noted here that the second wire of the second wiring layer 7 to be formed later may disconnect on the upper end of the opening 6a when the upper edge of the opening 6a is steep, i.e., when the surface of the first interlayer insulating film 6 continues to the side surface of the opening 6a with a steep angle.

It is therefore preferable that the upper end of the opening 6a is slanted by combining a plurality of insulating-film etching conditions. In the present embodiment, though not shown, the insulating film is first etched isotropically to provide a predetermined slant at a portion where the opening 6a is to be formed, before forming the opening 6a by anisotropic etching of the insulating film.

Thereafter, as shown in FIG. 6, the second wiring layer 7 is formed by depositing a conductive material on the first interlayer insulating film 6 and in the opening 6a. The second wiring layer 7 is then patterned into a predetermined wiring pattern to form the second wires 7a through 7c. In the present embodiment, the second wiring layer 7 is a laminate of a TiW film of about 150 nm thick and an AlSi film of about 1100 nm thick, for example.

Figure 7:
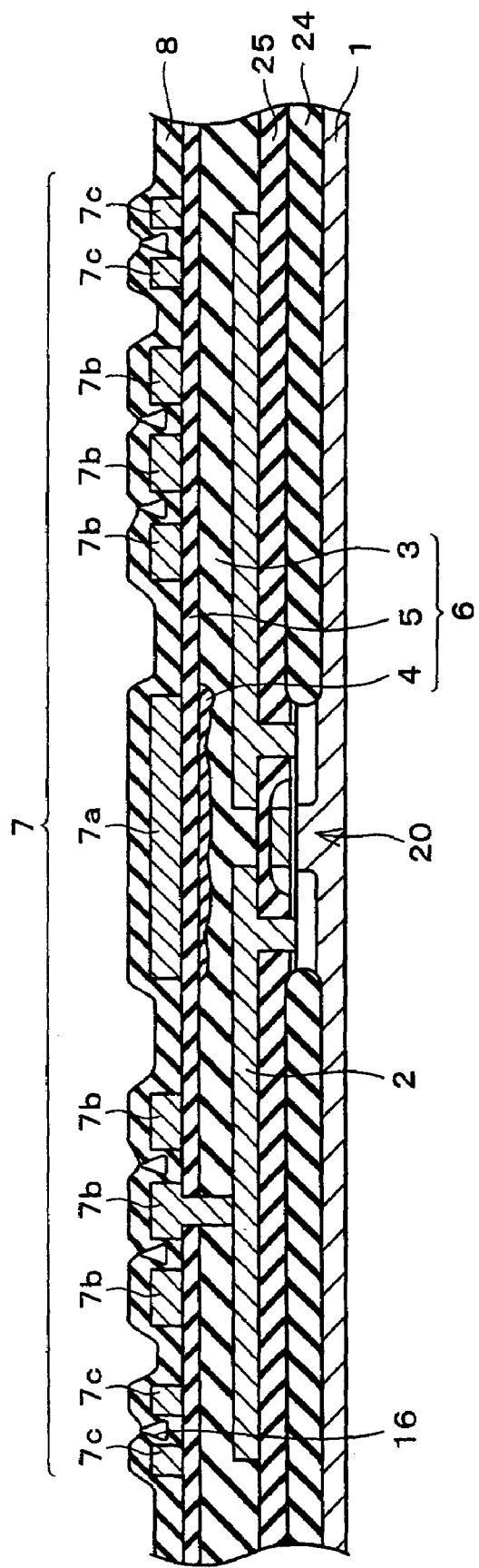
FIG. 7 is a cross sectional view explaining the fabrication process of the semiconductor integrated circuit, schematically showing a state after a protective layer forming step.

Then, as shown in FIG. 7, the protective film 8 is formed over the second wiring layer 7. The protective film 8 is provided to protect the surface of the semiconductor integrated circuit, and to insulate an area pad of an Au bump from the second wires 7a through 7c of the second wiring layer 7. As the protective film 8, a dense insulating film, for example, such as a nitride film is suitably used.

In the present embodiment, the distance between the second wires 7b and the thickness of the protective film 8 are adjusted to bridge the protective film 8 between adjacent second wires 7b, as shown in FIG. 2. In this way, instead of completely filing the gap between adjacent second wires 7b with the material of the protective film 8, the void 16 is formed in a portion of the gap between the second wires 7.

Figure 27:
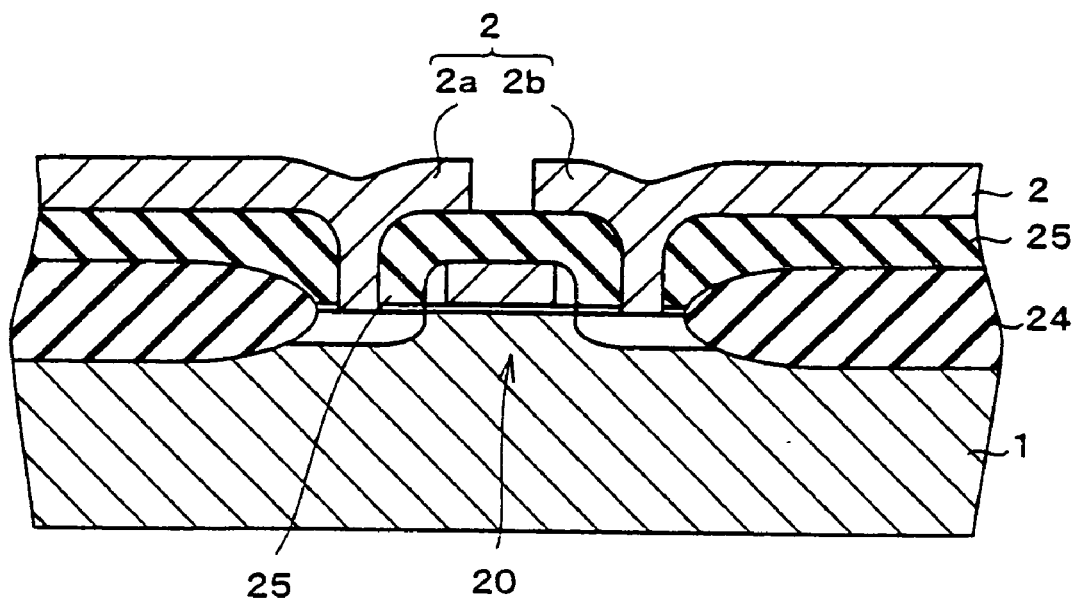
FIG. 27 is a cross sectional view explaining a fabrication process of the semiconductor integrated circuit, schematically showing a state after a first wiring layer forming step.
Figure 28:
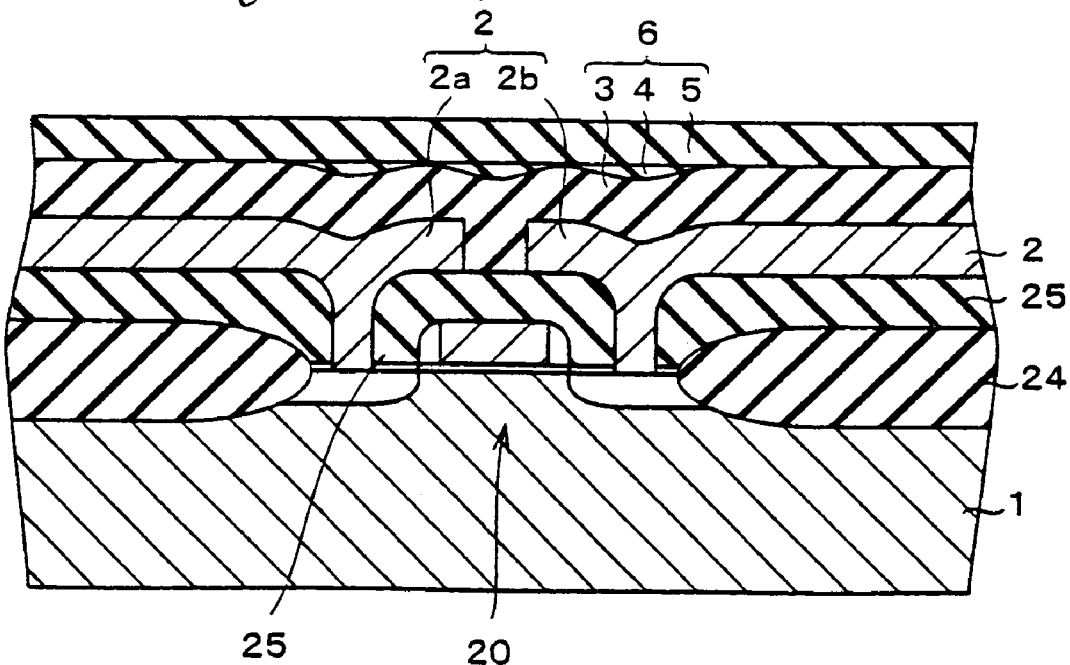
FIG. 28 is a cross sectional view explaining a fabrication process of the semiconductor integrated circuit, schematically showing a state after an interlayer insulating film forming step.
Figure 29:
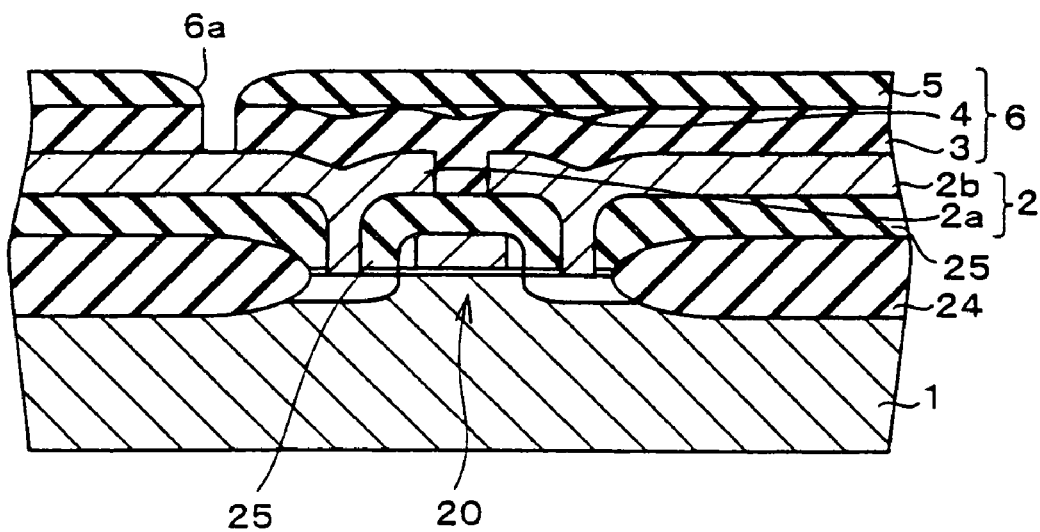
FIG. 29 is a cross sectional view explaining a fabrication process of the semiconductor integrated circuit, schematically showing a state after a step of forming an opening through the interlayer insulating film.
Figure 30:
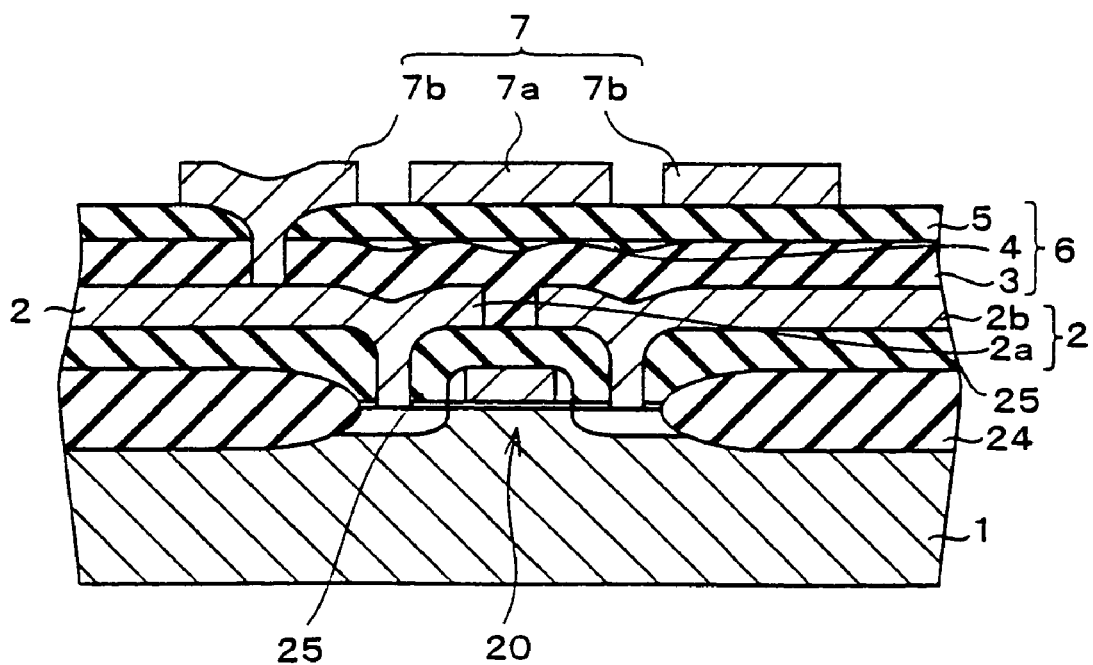
FIG. 30 is a cross sectional view explaining a fabrication process of the semiconductor integrated circuit, schematically showing a state after a second wiring layer forming step.
Figure 31:
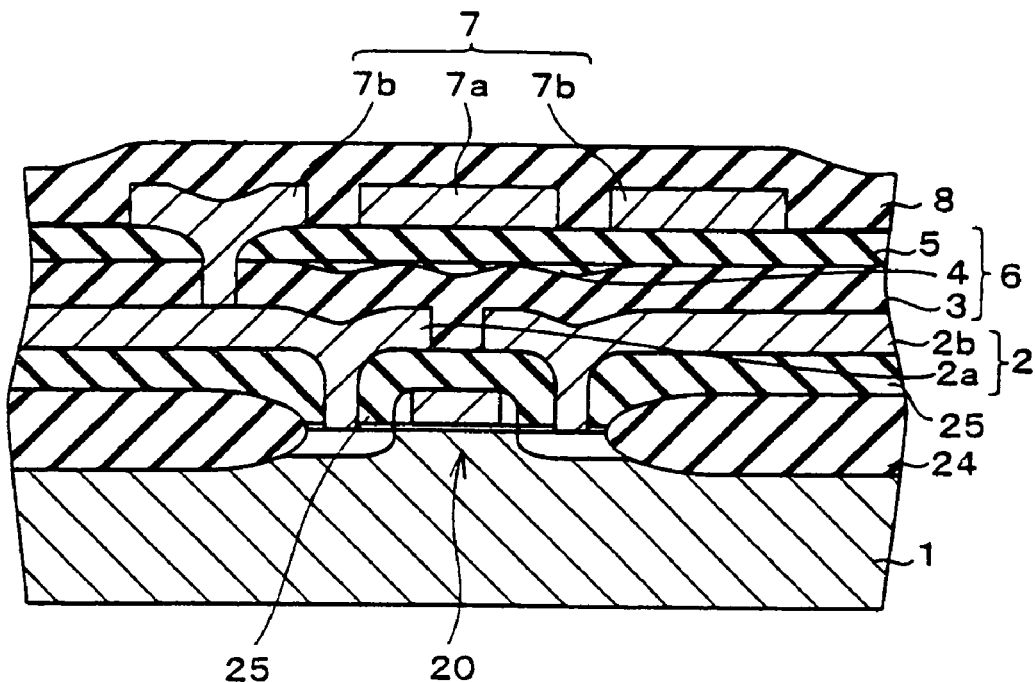
FIG. 31 is a cross sectional view explaining a fabrication process of the semiconductor integrated circuit, schematically showing a state after a protective layer forming step.
Figure 32:
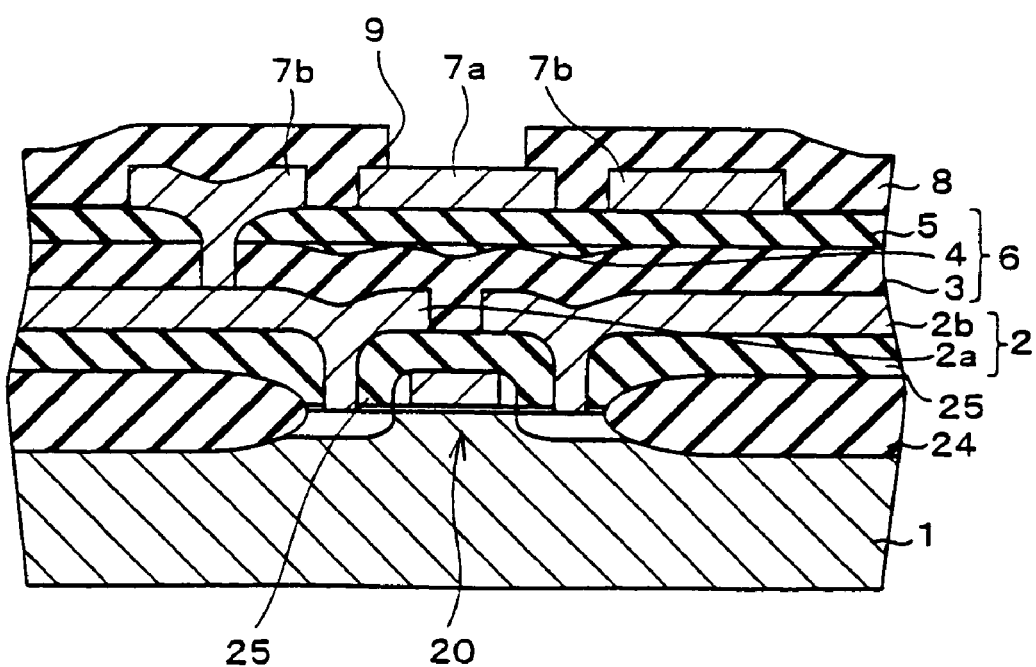
FIG. 32 is a cross sectional view explaining a fabrication process of the semiconductor integrated circuit, schematically showing a state after a step of forming an opening through the protective film.
Figure 33:
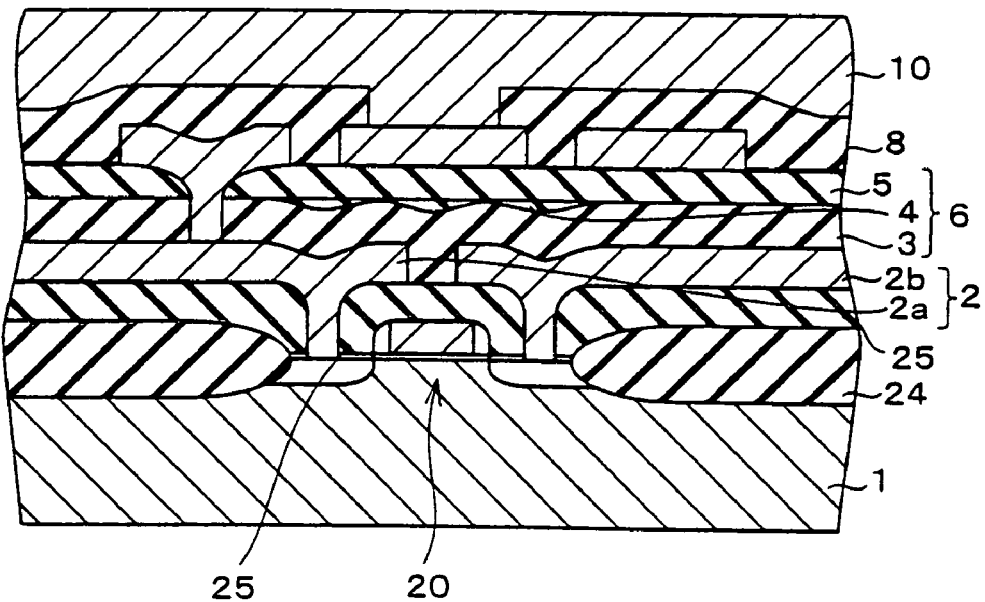
FIG. 33 is a cross sectional view explaining a fabrication process of the semiconductor integrated circuit, schematically showing a state after a shock absorbing film forming step.
Figure 34:
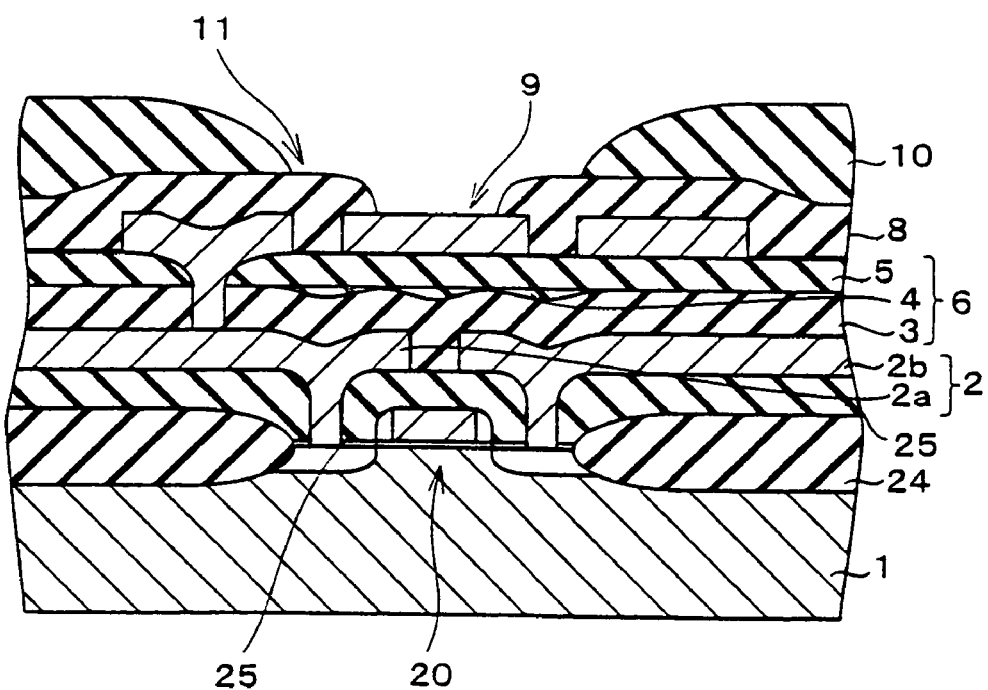
FIG. 34 is a cross sectional view explaining a fabrication process of the semiconductor integrated circuit, schematically showing a state after a step of forming an opening through the shock absorbing film forming step.
Figure 35:
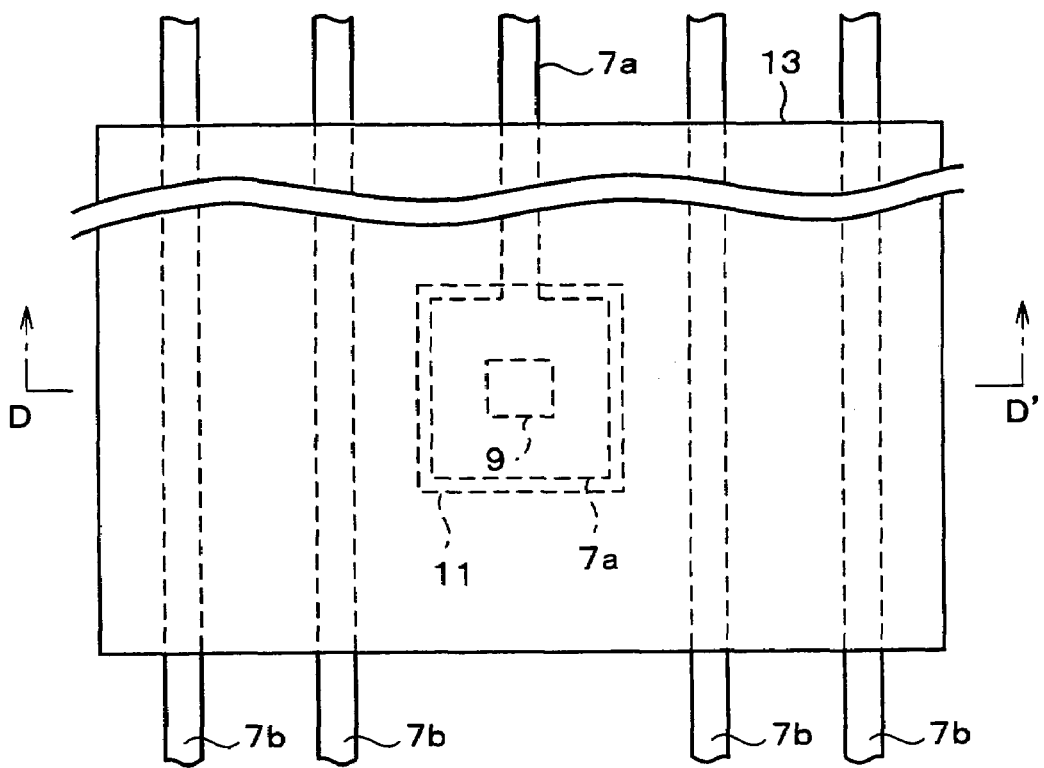
FIG. 35(a) is a schematic plan view of a semiconductor integrated circuit of a semiconductor device of another conventional example, diagrammatically showing wires formed in the semiconductor integrated circuit.
FIG. 35(b) is a cross sectional view schematically showing a semiconductor integrated circuit of the conventional semiconductor device, taken along the line D–D' of FIG. 35(a).
Figure 35:
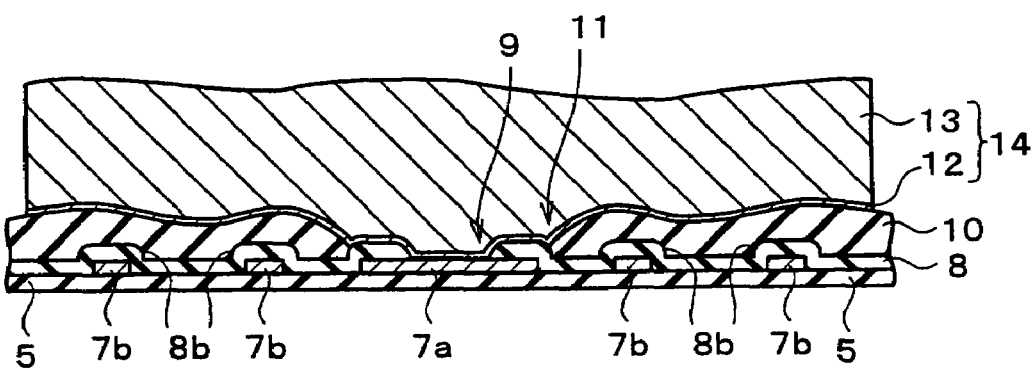
Figure 36:
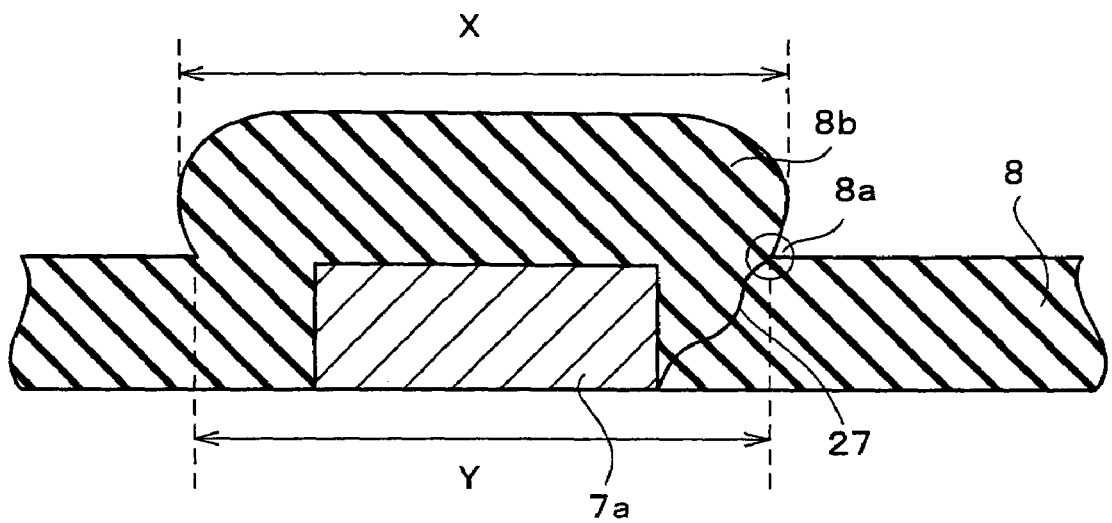
FIG. 36 is a partial cross sectional view of a protective film in the semiconductor integrated circuit of FIGS. 35(a) and 35(b), magnifying an overhung protrusion.
Figure 37:
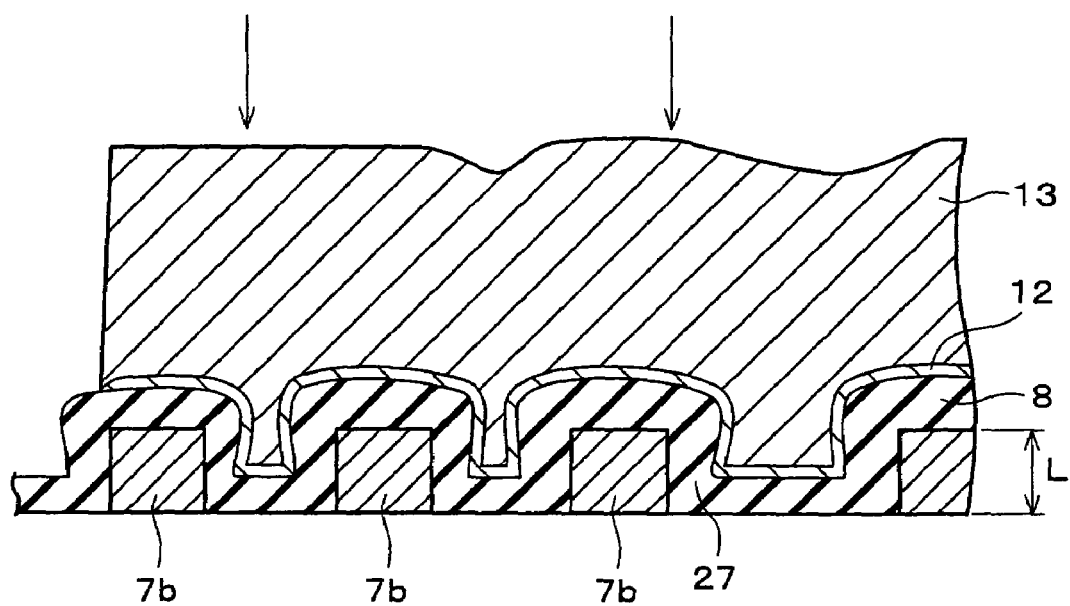
FIG. 37 is a cross sectional view schematically showing a structure after a bonding pad is formed on the protective film shown in FIG. 36.

Note that, the protective film 8 is formed by a plasma CVD method, and therefore, when the protective film 8 is thin, a crack may develop, as shown in FIG. 27 and FIG. 28, by the pressure of bonding the area pad, i.e., a chip with the bonding pad 14, onto the substrate. It is therefore preferable that the protective film 8 has a thickness L of not less than about 1 $\mu$m.

When the distance between the second wires are too wide, it becomes difficult to bridge the protective film 8 between adjacent second wires 7b, though it depends on the thickness of the protective film 8. Thus, when the protective film 8 has a thickness L of about 1 $\mu$m, the distance between the second wires 7b should preferably be not more than about 1.0 $\mu$m. In the present embodiment, the distance between the second wires is about 0.8 $\mu$m, and the protective film 8 is a laminate of a SiO$_x$ film of about 400 nm thick and a SiN film of about 720 nm thick, both of which are formed by a plasma CVD method.

Figure 8:
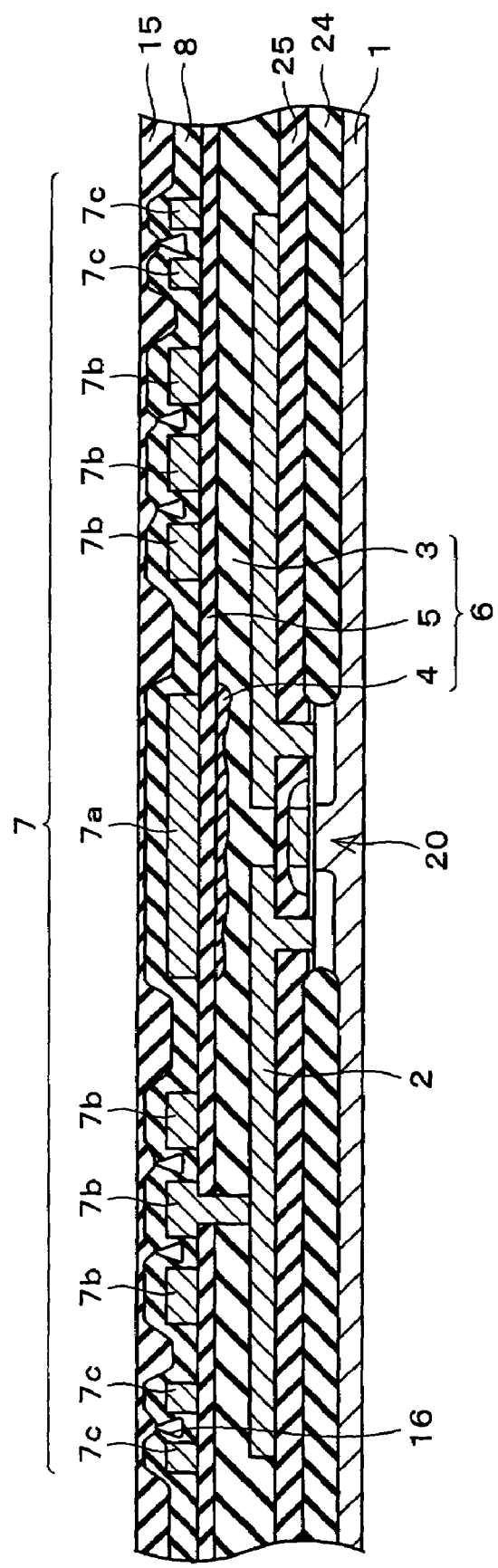
FIG. 8 is a cross sectional view explaining the fabrication process of the semiconductor integrated circuit, schematically showing a state after an insulating film forming step.
Figure 26:
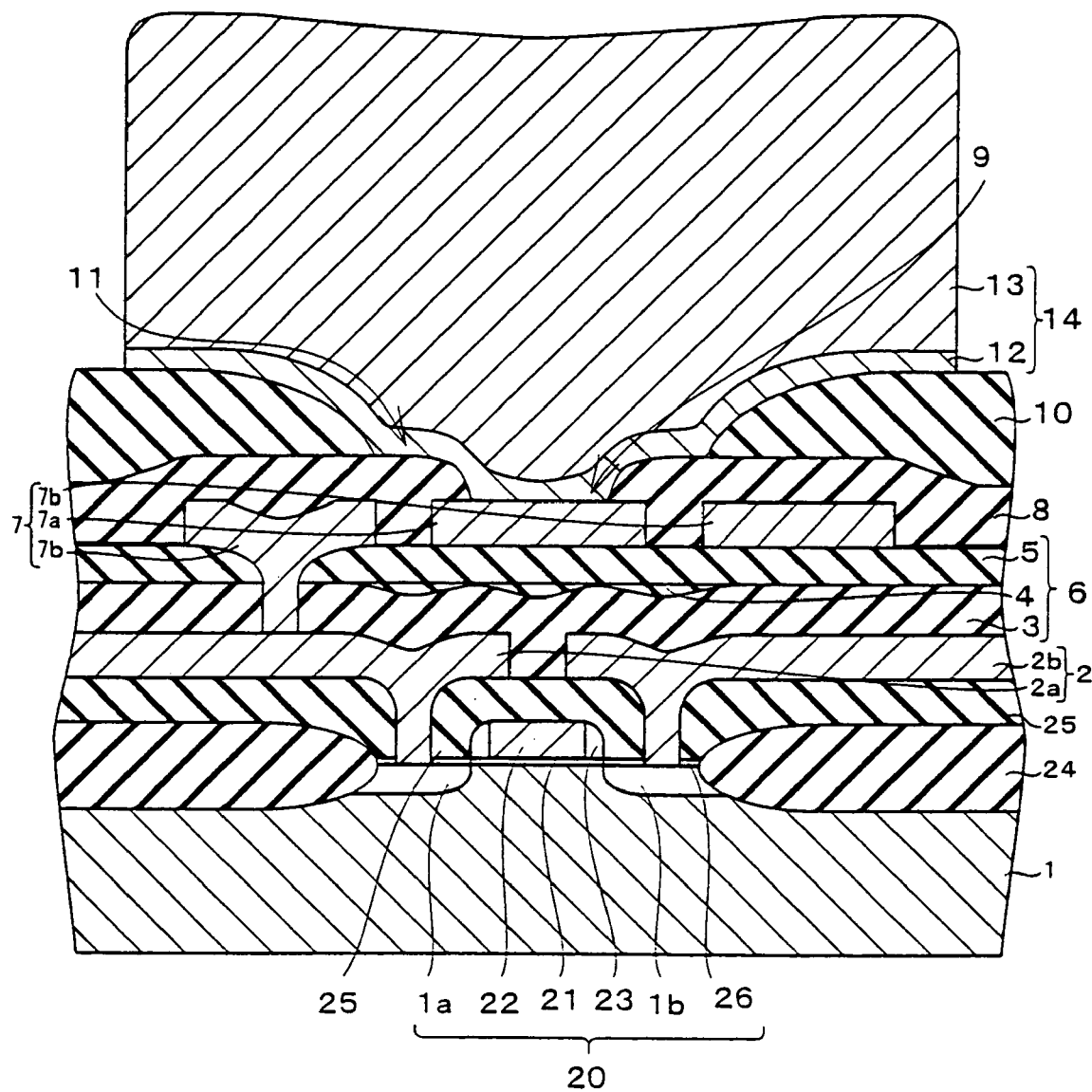
FIG. 26 is a cross sectional view schematically showing a structure of a semiconductor integrated circuit of a semiconductor device of one conventional example.

Thereafter, an insulating film 15 is formed over the protective film 8 of the bridged structure, as shown in FIG. 8. Preferably, the insulating film 15 is formed by a simple method such as spin coating, so that the irregularities on the protective film 8 can be planarized, and the insulating film 15 can be formed more easily than the conventional polyimide film 10 (see FIG. 26). Further, the insulating film 15 should preferably have a coefficient of thermal expansion smaller than that of the protective film 8, in order to prevent damage due to thermal expansion. The SOG film is an example of insulating film 15 that satisfies these conditions.

Figure 9:
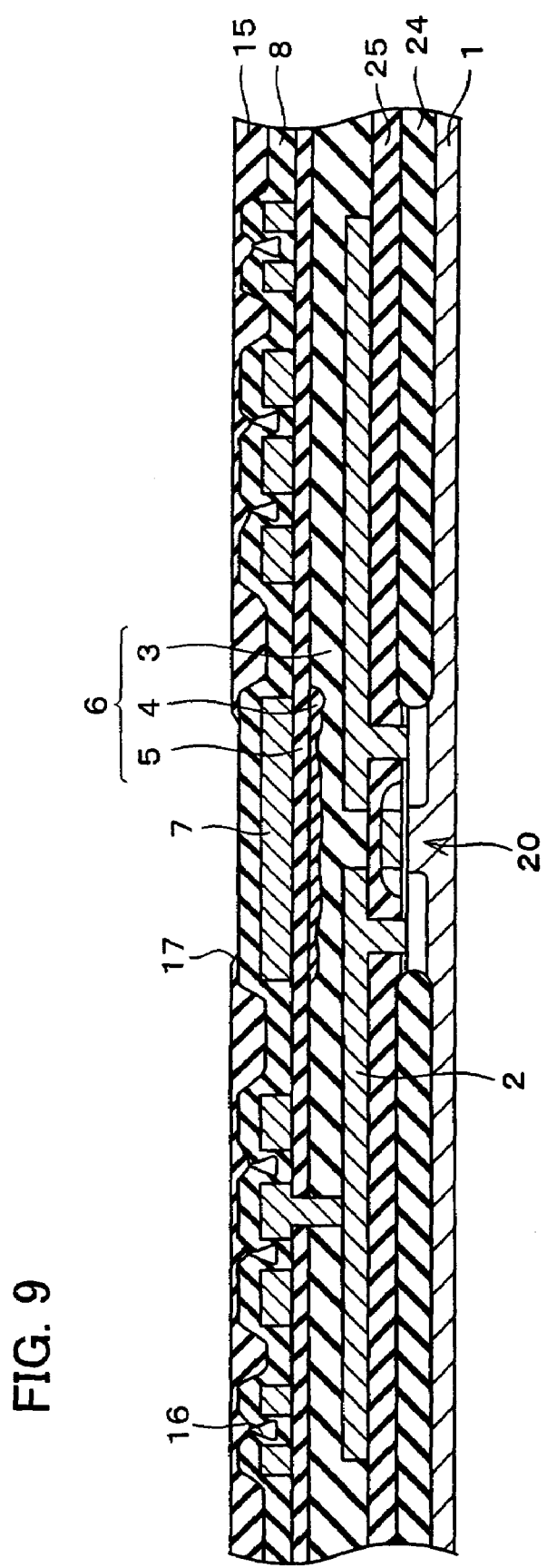
FIG. 9 is a cross sectional view explaining the fabrication process of the semiconductor integrated circuit, schematically showing a state after a step of forming an opening through the insulating film.
Figure 10:
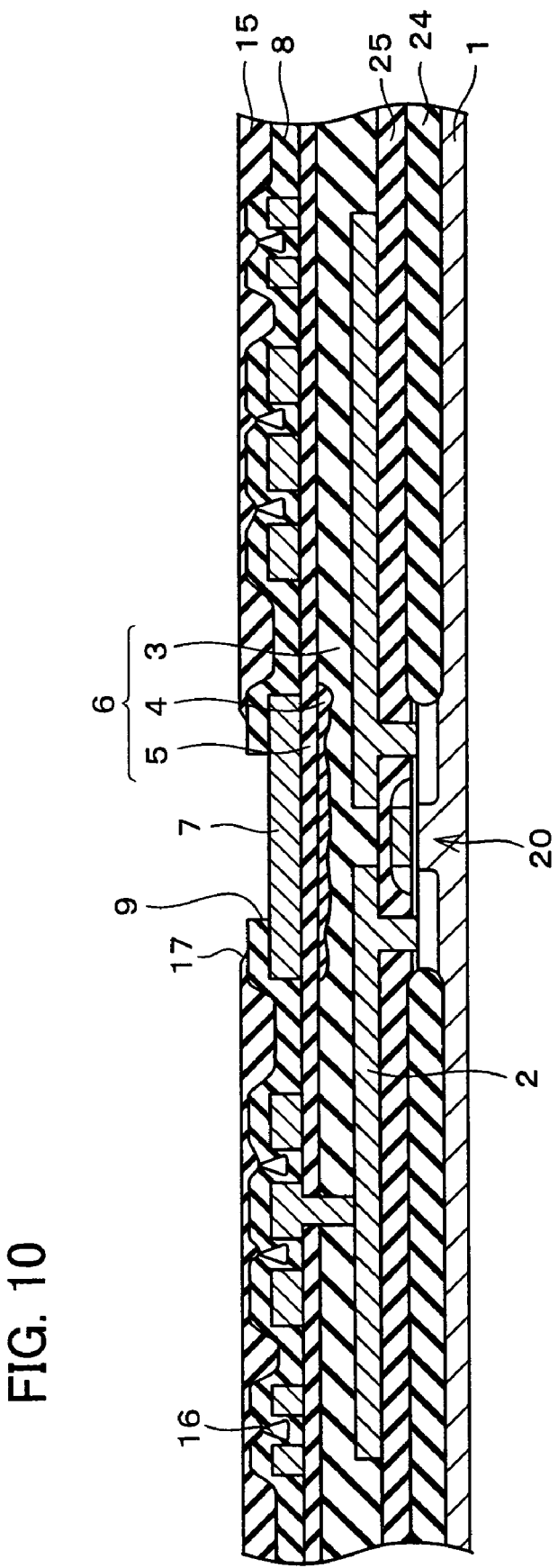
FIG. 10 is a cross sectional view explaining the fabrication process of the semiconductor integrated circuit, schematically showing a state after a step of forming an opening through the protective film.

Next, in order to expose the second wire 7a to be connected to the bonding pad 14, an opening 17 is formed through a predetermined portion of the insulating film 15, as shown in FIG. 9. In addition, an opening 9 is formed through a predetermined portion of the protective film 8 exposed through the opening 17, as shown in FIG. 10.

In this way, the opening 9 of the protective film 8 is within the opening 17 of the insulating film 15. In other words, the opening 17 of the insulating film 15 is wider than the opening 9 of the protective film 8.

Further, because substantially the same device or same type of gas can be used to etch the protective film 8 and the insulating film 15, the openings 17 and 9 are formed after forming the protective film 8 and the insulating film 15. This enables the openings to be formed in a fewer number of steps, compared with forming the opening 9 and the opening 17 after forming the protective film 8 and the insulating film 15, respectively.

As noted earlier, it is preferable that the upper end of the openings be slanted. In the present embodiment, the insulating film is first etched isotropically to provide a predetermined slant at a portion where the openings 17 and 9 are to be formed, before forming the openings 17 and 9 by anisotropic etching of the insulating film.

Slanting the upper end of the openings 17 and 9 is advantageous in the following respect, in addition to preventing electrical disconnection as noted earlier. That is, as shown in FIG. 1, the bonding pad (area pad) 14, to be formed later, can have a depression 18 that is gradually depressed from the upper surface. This enables the upper surface of the bonding pad 14 to be connected to an external terminal without increasing contact resistance.

Then, as shown in FIG. 1, the bonding pad 14, including a barrier metal 12 and a Au bump 13, is formed over the openings 9 and 17 formed through the protective film 8 and the insulating film 15, and over a plurality of wires 7a and 7b of the second wiring layer 7 covered with the protective film 8.

More specifically, first, a thin film of metal and a thin film of gold (Au), which together make up the barrier metal 12, are deposited. The barrier metal 12 is provided to prevent a chief metal of the area pad, for example, such as gold (Au), from reacting with the material of the conductive layer constituting the wires. The barrier metal 12 also serves as an electrode when forming the area pad by plating.

Thereafter, using the barrier metal 12 as an electrode, the Au bump 13, having a predetermined thickness, is formed in a predetermined position, i.e., the area pad is formed. The Au bump 13 is sized to have larger dimensions than the opening 17 formed through the insulating film 15. Then, using the Au bump 13 as a mask, unnecessary portions of the barrier metal 12 are removed to form the bonding pad 14, thereby fabricating the semiconductor integrated circuit shown in FIG. 1.

In the present embodiment, the barrier metal 12 is formed by depositing a TiW thin film of 250 nm thick and a Au thin film of 170 nm thick. Then, using the thin film of the barrier metal 12 as an electrode, gold (Au) is plated to a thickness of about 10 $\mu$m, thereby forming the Au bump 13 (area pad) that measures approximately 35 $\mu$m×50 $\mu$m.

According to the fabrication process described above, because the protective film of a bridge structure is formed in the step of forming the protective film 8, a crack 27 is prevented in a lower portion of the protective film 8, as described above. Further, because the voids 16 formed under the bridge serve as an air spring, it is possible to prevent damage to the structural elements formed under the protective film 8, including the wire 7. Further, it is not required to provide the step of forming the polyimide film 10 as a shock absorber on the protective film 8, thereby improving working efficiency and reducing chip cost.

Figure 11:
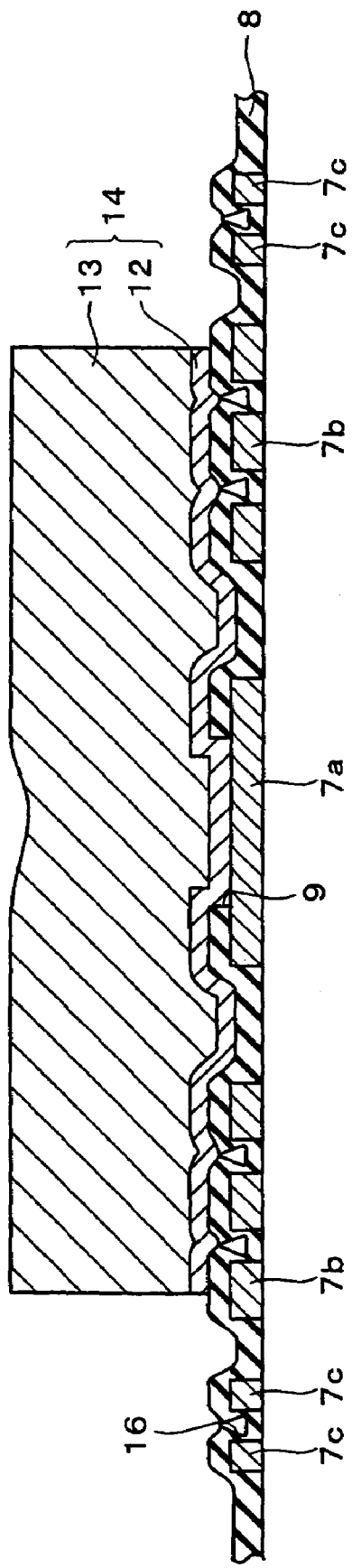
FIG. 11 is a cross sectional view schematically showing a structure of the semiconductor integrated circuit, when the insulating film is not formed on the protective film.

Note that, in the present embodiment, the insulating film 15 is formed on the protective film 8. Alternatively, as shown in FIG. 11, the bonding pad 14 may be formed directly on the protective film 8, without forming the insulating film 15. However, in this case, the following problems may be caused.

As shown in FIG. 2, the voids 16 are formed between adjacent second wires 7c. As illustrated, the voids 16 are basically surrounded by the protective film 8, and do not communicate with outside. However, depending on designing of second wires 7b and 7c, some of the voids may not be covered with the protective film 8 (such a void is called a void opening hereinafter).

Figure 12:
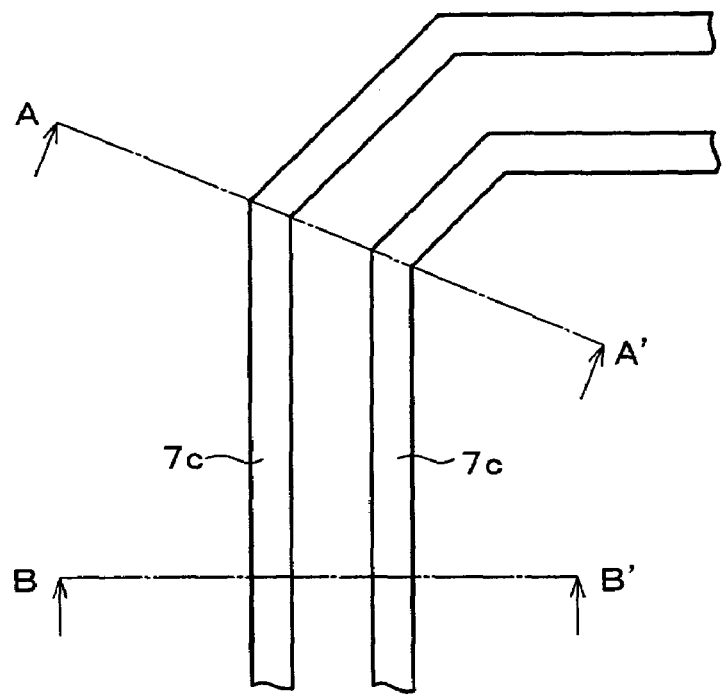
FIG. 12 is a plan view diagrammatically showing wires in the semiconductor integrated circuit shown in FIG. 11.

FIG. 12 shows one design example of the second wires 7c with a void opening 28. When the protective film 8 is formed over the second wires shown in FIG. 12, the protective film 8 is bridged between adjacent second wires at portions other than corners, as shown in FIG. 13(b), thereby forming voids 16 directly under the bridge portion, surrounded by the protective film 8.

On the other hand, at the corners, the distance between adjacent second wires 7c is wide, and therefore the protective film 8 does not form a bridge between adjacent second wires 7c, as shown in FIG. 13(a). As a result, the void opening 28 is formed between adjacent second wires 7c, opening upward. With the void opening 28, the voids 16 communicate with outside through the void opening 28.

In this case, when the opening 9 is formed through the protective film 8 by photolithography after forming the protective film 8, the resist material moves into the void 16 through the void opening 28. In a subsequent heat treatment step such as a resist curing step (post baking step), the resist material may scatter out of the void opening 28 in the form of air vesicles generated by the expansion of air or vaporization of organic materials. In this case, the protective film 8 may be lost in portions where it is required, with the result that the moisture resistance of the protective film 8 deteriorates.

Further, part of the photoresist layer may detach, and the resist pattern may be changed, with the result that a desired shape may not be obtained for the opening 9. Further, the scattered resist material may contaminate equipment, or may adhere to an area where the bonding pad 14 is to be formed, causing the adhesion between the protective film 8 and the bonding pad 14 to weaken. The same problem may be caused when photolithography is performed to form the Au bump 13 of the bonding pad 14.

Figure 14:
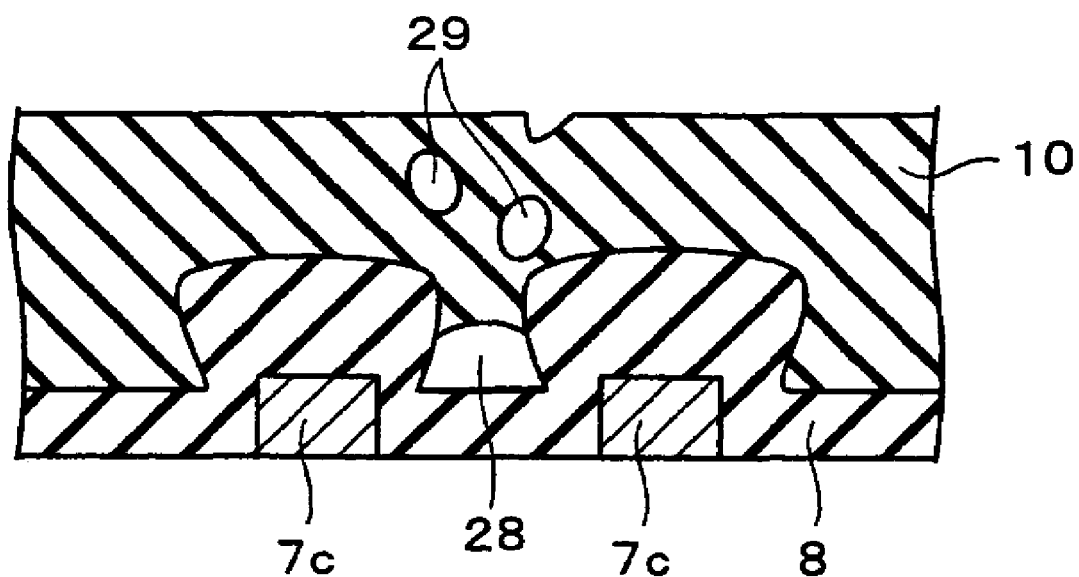
FIG. 14 is a cross sectional view showing how a polyimide film is formed on the protective film, taken along the line A–A' of FIG. 12.

Further, in the case where a PIQ (polyimide resin:polyimide film) 10 is formed for surface protection in mounting, air vesicles 29 may spurt out of the void opening 28 in a heat treatment in the step of forming the PIQ, for example, in a heat treatment step in a PIQ curing step, as shown in FIG. 14, with the result that the PIQ scatters.

Further, in a heat treatment for forming the barrier metal 12, the air vesicles spurting out of the void opening 28 may spout out and contaminate equipment, or adheres to the barrier metal 12 to weaken the adhesion between the protective film 8 and the barrier metal 12.

In order to avoid these problems, the insulating film 15 should preferably be formed over the protective film 8. In this way, the void opening 28 is covered by the insulating film 15, and the void 16 is prevented from communicating with outside, thereby preventing the foregoing problems.

[Second Embodiment]

Figure 15:
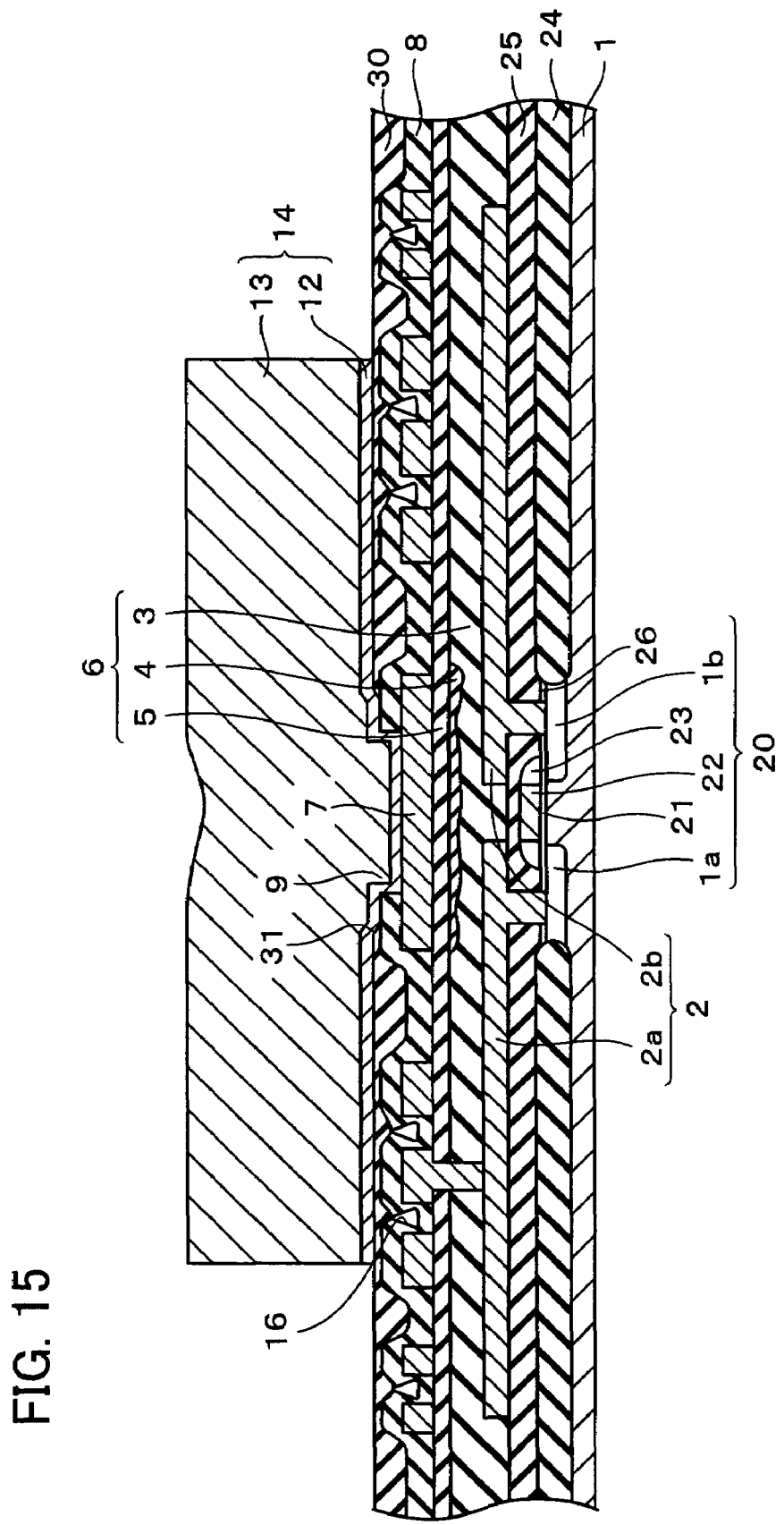
FIG. 15 is a cross sectional view schematically showing a structure of a semiconductor integrated circuit in a semiconductor device of another embodiment of the present invention.

The following describes another embodiment of the present invention with reference to FIG. 15. FIG. 15 schematically illustrates a structure of a semiconductor integrated circuit in a semiconductor device of the present embodiment.

The semiconductor integrated circuit of the present embodiment has the same structure as the semiconductor integrated circuit shown in FIG. 1, except that an oxide film 30 formed by a CVD method (CVD oxide film 30 hereinafter) is provided as an insulating film, instead of the SOG film 15. Accordingly, constituting elements having the same functions as those already described in the foregoing embodiment is given the same reference numerals and explanations thereof are omitted here.

In the First Embodiment, the SOG film 15 is formed as an insulating film to cover the void opening 28. However, owning to the fact that the SOG film 15 is a porous film and has a large water content, problems may arise in the next bump forming step, i.e., in the step of forming the bonding pad 14.

As described earlier, the barrier metal (TiW) film 12 is first formed in the step of forming the bonding pad 14. The barrier metal 12 is formed by sputtering under high vacuum conditions. Here, the SOG film 15 releases water vapor and lowers a vacuum level in a sputtering device. As a result, it takes time to reach a required level of vacuum for sputtering.

Further, before forming the barrier metal 12, sputter-etching of the second wire 7a is carried out with Ar gas etc. to lower and stabilize the contact resistance between the barrier metal 12 and the second wire 7a.

Here, the surface of the SOG film 15 is also etched by being bombarded with Ar ions, with the result that dust is generated in the equipment. Specifically, the etched SOG adheres to the wafer and forms a core from which a sputtering film grows. The sputtering film, when it remains on the wafer, may cause shorting of two lead wires during mounting.

Further, by being etched, the SOG film 15 becomes fragile and easily generates cracking in response to applied pressure during mounting after forming the bonding pad 14.

Further, the SOG film 15 is formed by a coating method. The coating method requires a heat treatment step for removing solvent, and an etch back step, in addition to the step of coating SOG. That is, more steps are required.

In view of these problems, the present embodiment forms the CVD oxide film 30, instead of forming the SOG film 15 by a coating method. Using a conventional ordinary-pressure CVD device, the CVD oxide film 30 is formed over the entire surface to a thickness of 1 μm, covering the protective film 8. Note that, in order to use an ordinary-pressure CVD method for the CVD oxide film 30, the CVD oxide film 30 should preferably contain at least one of boron (B) and phosphor (P).

The CVD oxide film 30 is denser than the SOG film 15 and contains less water. This reduces the amount of vacuum drop in the sputtering device when forming the barrier metal 12 by sputtering, thus forming the barrier metal 12 in a shorter time period.

Further, because the amount of CVD oxide film 30 etched by the sputter-etching that is performed before forming the barrier film 12 is small, less amount of dust is generated in the equipment, and cracking caused by applied pressure during mounting can be suppressed.

Further, with the CVD method, the number of fabrication steps can be reduced, because the CVD method can form the film with a more stable etching rate than the coating method, and accordingly does not require forming a thin film in the etch back step. Note that, in order to desirably form the bonding pad 14 on the CVD oxide film 30, the bonding pad 14 may be formed on the CVD oxide film 30 after planarizing the CVD oxide film 30.

Further, by including at least one of boron (B) and phosphor (P) in the CVD oxide film 30, the CVD oxide film 30 can be formed by an ordinary-pressure CVD method. The ordinary-pressure CVD method has a higher deposition rate than the vacuum CVD method, and therefore is advantageous in terms of mass production and manufacturing cost.

[Third Embodiment]

Figure 16:
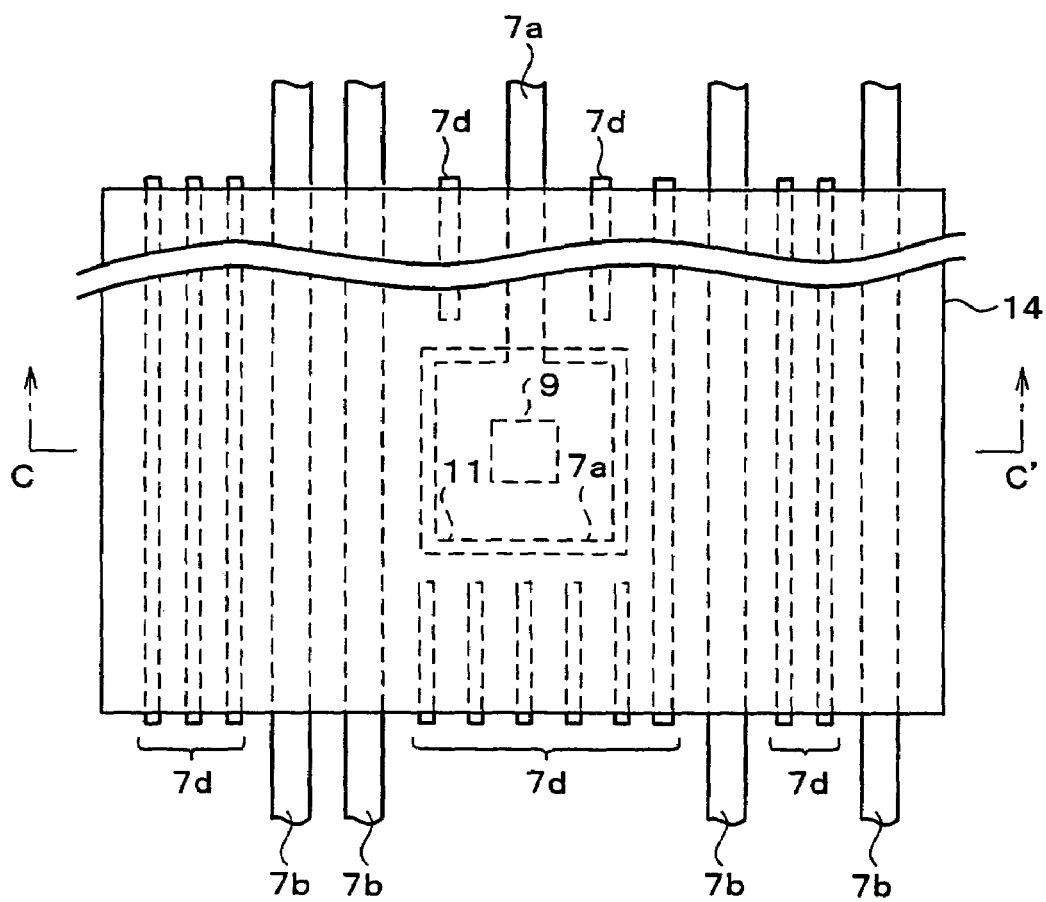
FIG. 16(*a*) is a schematic plan view of a semiconductor integrated circuit in a semiconductor device of yet another embodiment of the present invention, diagrammatically showing wires formed in the semiconductor integrated circuit.
Figure 16:
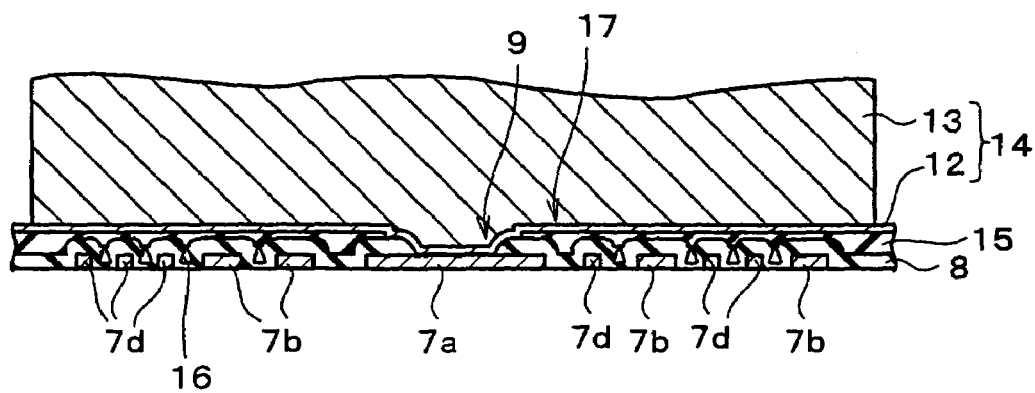

The following describes yet another embodiment of the present invention with reference to FIG. 16(a) and FIG. 16(b). FIG. 16(a) and FIG. 16(b) schematically illustrate a structure of a semiconductor integrated circuit in a semiconductor device of the present embodiment.

The semiconductor integrated circuit of the present embodiment has the same structure as the semiconductor integrated circuit shown in FIG. 1, except that dummy wires 7d are provided in addition to the second wires 7a through 7c. Accordingly, constituting elements having the same functions as those described in the foregoing embodiment are given the same reference numerals and explanations thereof are omitted here.

As described earlier, when the distance between adjacent second wires 7b is wide, the protective film 8 formed on the second wires 7b cannot have a bridge structure but assumes a conventional overhang structure.

In order to avoid this, as shown in FIG. 16(a) and FIG. 16(b), in a region of the second wiring layer 7 covered with the bonding pad 14, the present embodiment provides the dummy wires 7d that are not involved in device operations (operations of the semiconductor element 20 and operations of external devices including other semiconductor elements (not shown)), in addition to the second wires 7a and 7b that are involved in device operations.

With this structure, when the protective film 8 is formed after forming the second wiring layer 7 including the dummy wires 7c, the protective film 8 assumes a bridge structure not only between adjacent second wires 7b but also between adjacent dummy wires 7d as well. That is, the protective film 8 has a bridge structure between the second wires 7b and between the second wire 7b and the dummy wire 7d as well.

Thus, with the dummy wires 7d, the protective film 8 can have a bridge structure at least over the entire area where the bonding pad 14 is formed, thus ensuring that the protective film 8 serves as a shock absorber against the stress exerted on the protective film 8 through the bonding pad 14.

[Fourth Embodiment]

Figure 17:
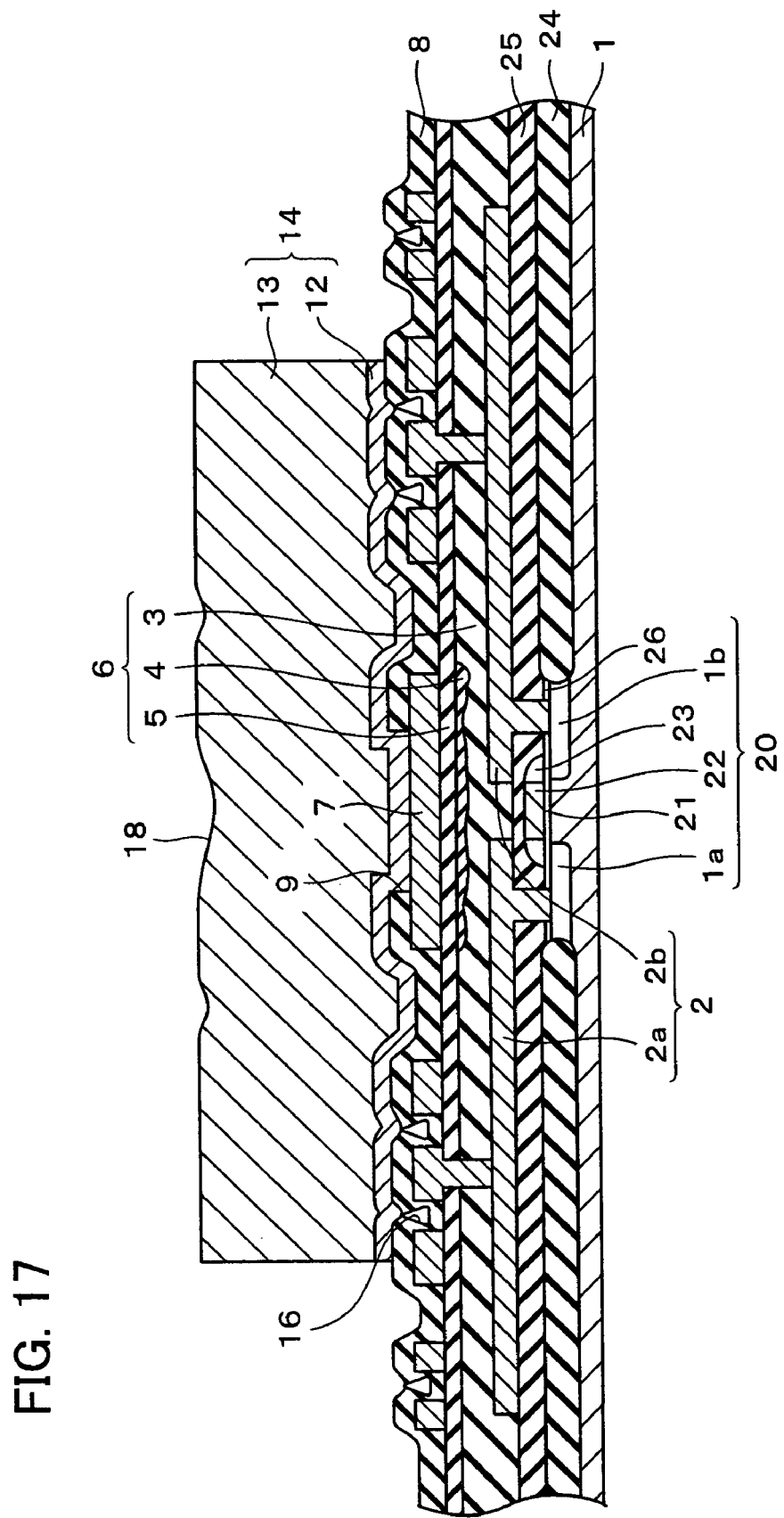
FIG. 17 is a cross sectional view schematically showing a semiconductor integrated circuit in a semiconductor device of still another embodiment of the present invention.

The following describes yet another embodiment of the present invention with reference to FIG. 17 through FIG. 25. FIG. 17 schematically illustrates a structure of a semiconductor integrated circuit in a semiconductor device of the present embodiment.

The semiconductor integrated circuit of the present embodiment has the same structure as the semiconductor integrated circuits shown in FIG. 1 through FIG. 15, except that the bonding pad 14 is directly formed on the protective film 8 by omitting the insulating films 15 and 30, and that the wiring pattern of the second wires 7a through 7c is changed according to predetermined conditions to suppress or prevent scattering of a resist material through the void opening 28. Accordingly, constituting elements having the same functions as those described in the foregoing embodiments are given the same reference numerals and explanations thereof are omitted here.

Figure 18:
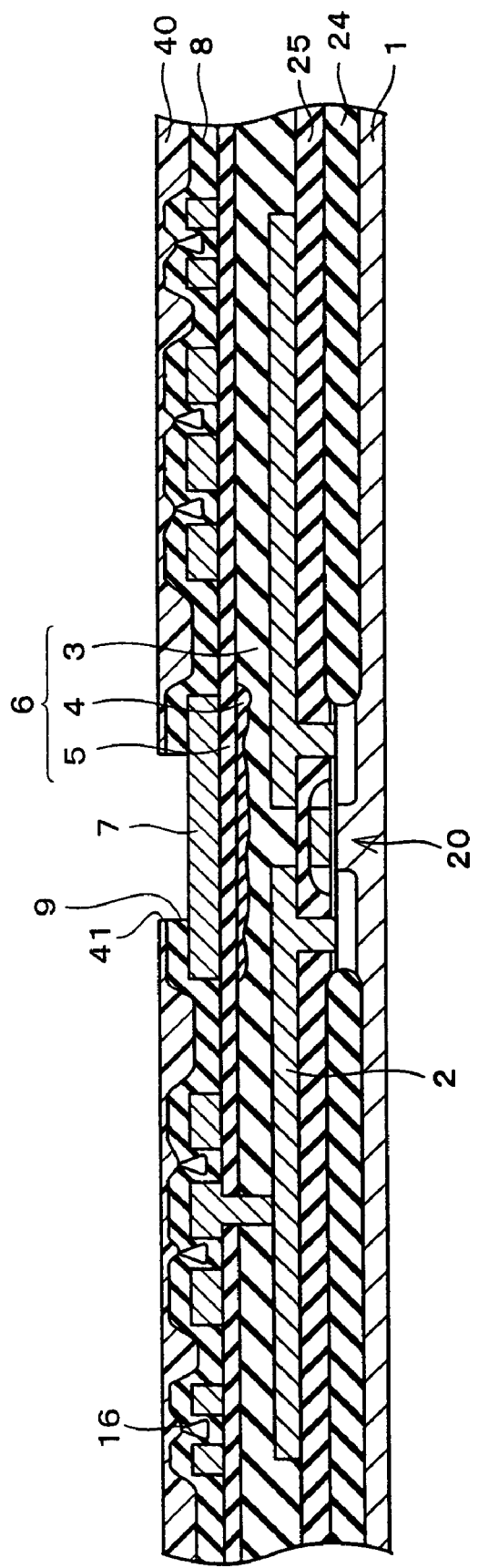
FIG. 18 is a cross sectional view explaining a fabrication process of the semiconductor integrated circuit, schematically showing a state after a step of forming an opening through a protective film.
Figure 19:
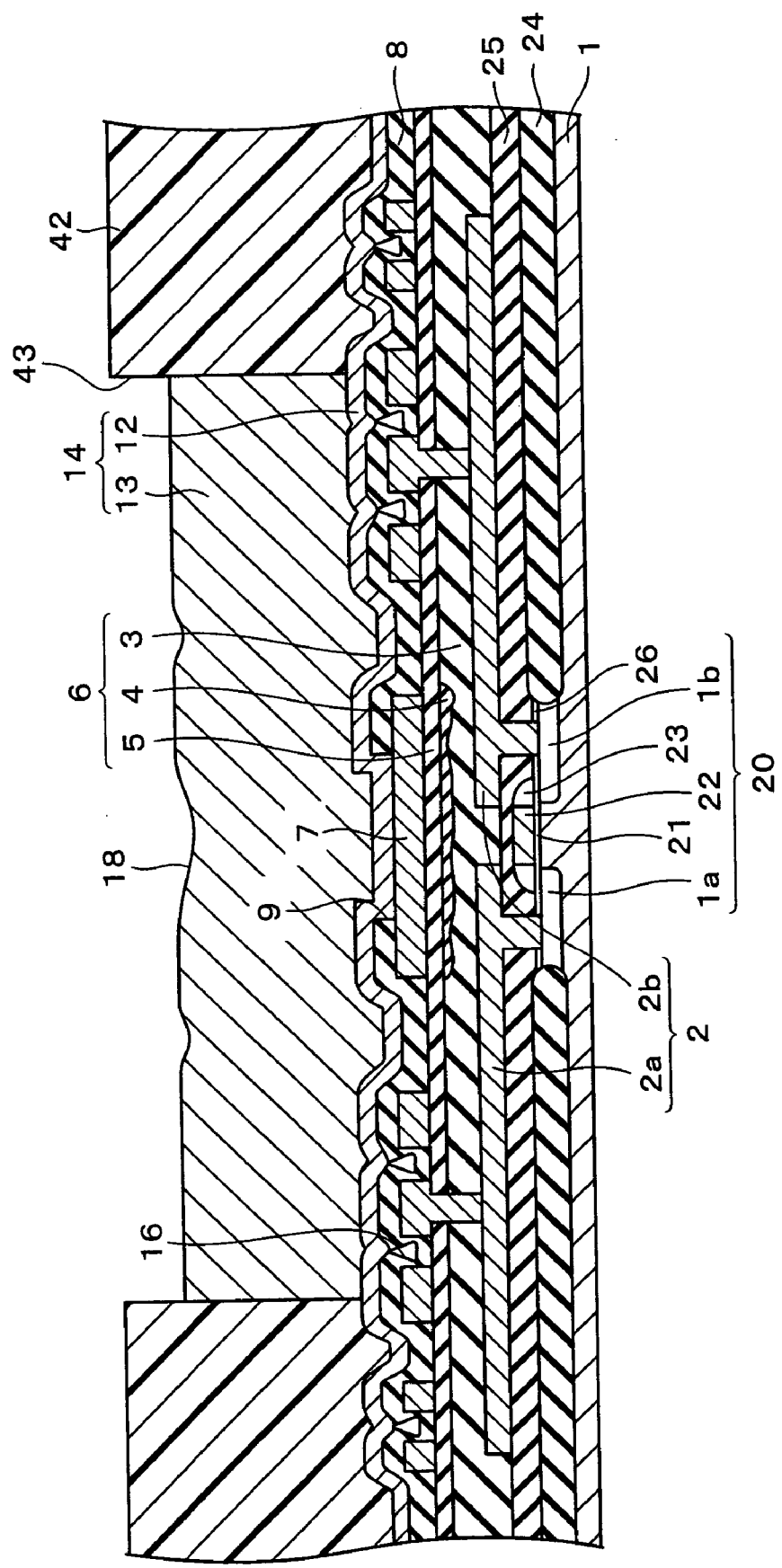
FIG. 19 is a cross sectional view explaining a fabrication process of the semiconductor integrated circuit, schematically showing a state after a gold bump forming step.

Referring to FIG. 18 and FIG. 19, a fabrication process of the semiconductor integrated circuit is described below. It should be noted here that, up to the step of forming a protective film, the fabrication process is the same as that described with reference to FIG. 3 through FIG. 7. Accordingly, these duplicate steps will not be described. Further, the present embodiment also has the step of forming the second wiring layer 7 shown in FIG. 6 but with a different wiring pattern.

After forming the protective film 8, an opening 9 is formed through the protective film 8 by photolithography and etching, so as to expose the second wire 7a to be connected to the bonding pad 14, as shown in FIG. 18. That is, a photoresist layer 40 with an opening 41 is formed in a resist coating step, exposure step, and development step, and the protective film 8 exposed through the opening 41 is etched to form the opening 9.

In the present embodiment, the insulating films 15 and 30 covering the protective film 8 are omitted, and accordingly a void 16 may be created that is in communication with outside. In this case, a resist material enters the void 16 through the void opening 28 when forming the photoresist layer 40 in the resist coating step. The resist material in the void 16 may scatter out of the void opening 28 in a later heat treatment step. Further, in the heat treatment step, air vesicles created by the expansion of air or vaporization of organic materials may spout out of the void 16 to swell or damage the photoresist layer 40.

Thereafter, as shown in FIG. 19, the photoresist layer 40 is removed, the barrier metal 12 is laminated, and the Au bump 13 is formed by photolithography and plating in a region including the opening 9. That is, in the resist coating step, the exposure step, and the development step, a resist layer 42 with an opening 43 is formed in a region including the opening. Then, the Au bump 13 is formed in the opening 43 by depositing (plating) gold, using the barrier metal 12 as an electrode.

As described above, in the present embodiment, a resist material enters the void 16 through the void opening 28 when forming the photoresist layer 42 in the resist coating step. The resist material in the void 16 may scatter out of the void opening 28 in a later heat treatment step. Further, in the heat treatment step, air vesicles created by the expansion of air or vaporization of organic materials may spout out of the void 16 to swell or damage the photoresist layer 42.

Then, using the Au bump 13 as a mask, the photoresist layer 42 and unnecessary portions of the barrier metal are removed to form the bonding pad 14, thereby forming the semiconductor integrated circuit shown in FIG. 17.

In the described manner, a resist material enters the void 16 through the void opening 28 in the step of forming the photoresist layers 40 and 42. The resist material may scatter out of the void 16, or air vesicles may spout out of the void 16 in the heat treatment step of curing the photoresist layers 40 and 42. This is detrimental to the fabrication of the semiconductor device.

Figures 20, 21:
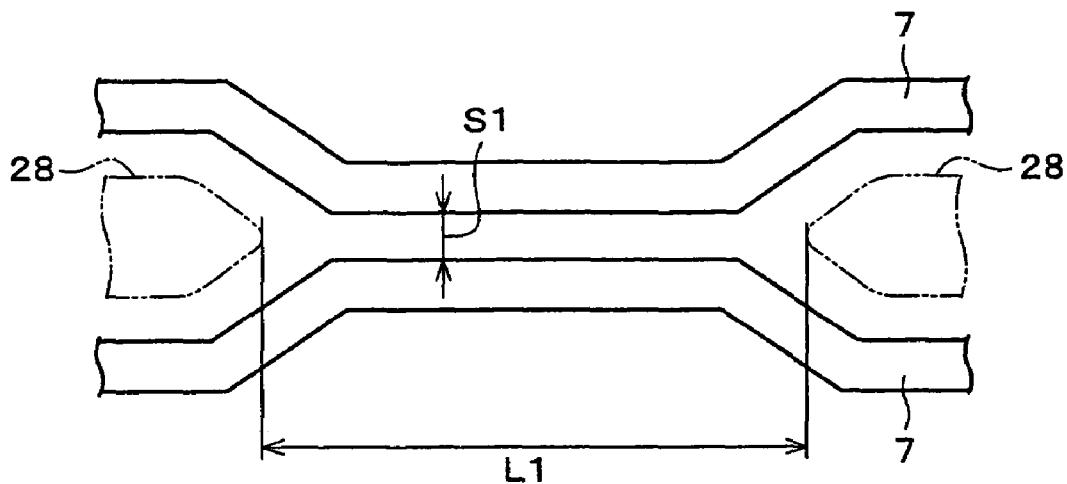
FIG. 20 is a plan view diagrammatically showing an example of a wiring pattern of wires used for an experiment.
FIG. 21 represents tables, wherein the upper table indicates a result of experiment, and the lower table indicates denotations of symbols used in the upper table.

In view of these problems, the inventors of the present invention conducted an experiment to examine how the resist material scatters out of the void 16 when the wiring pattern of the second wires 7 is varied. FIG. 20 illustrates one of the wiring patterns used in the experiment.

In this experiment, as illustrated in FIG. 20, the distance between adjacent second wires 7 was varied to intentionally create a region where the protective film 8 forms a bridge between these second wires 7 and a region where the protective film 8 does not form a bridge between these second wires 7. Further, in the experiment, two variables, L1 and S1, were varied, where L1 is the distance between two void openings 28, i.e., the length of the bridge formed by the protective film 8 between the adjacent second wires 7, and S1 is the minimum value of the distance between the adjacent second wires 7 in the region where the bridge is formed.

In FIG. 21, the upper table represents the result of experiment when the thickness t of the protective film was 1.2 $\mu$m. The lower table indicates the respective denotations of symbols ○, △, and × used in the upper table.

Specifically, the symbol ○ indicates that there was no scattering of the resist material and no swelling of the photoresist layers 40 and 42. The symbol △ indicates no scattering of the resist material but swelling of the photoresist layers 40 and 42, and the symbol × indicates scattering of the resist material and swelling of the photoresist layers 40 and 42.

It can be seen from FIG. 21 that scattering of the resist material can be prevented when the minimum value S1 of wire distance is not less than 1.8 $\mu$m or when the length L1 of the bridge is not more than 900 $\mu$m, or, alternatively, when the minimum value S1 of wire distance is in a range of from not less than 1.2 $\mu$m to less than 1.8 $\mu$m, and when the length L1 of the bridge is not more than 1400 $\mu$m. It can also be seen that scattering of the resist material and swelling of the photoresist layers 40 and 42 can be prevented at the same time when the minimum value S1 of wire distance is not less than 1.8 $\mu$m, or when the length L1 of the bridge is not more than 400 $\mu$m.

It should be noted here that the minimum value S1 of wire distance is necessarily smaller than the minimum value of wire distance where no bridge is formed. Theoretically, the minimum value of wire distance where no bridge is formed is twice the thickness t of the protective film.

Referring to FIG. 22 through FIG. 25, the following describes examples of wiring patterns that are designed to create a region, as illustrated in FIG. 20, in which the protective film 8 forms a bridge between adjacent second wires 7, and a region in which the protective film 8 does not form a bridge between adjacent second wires 7.

Figure 22:
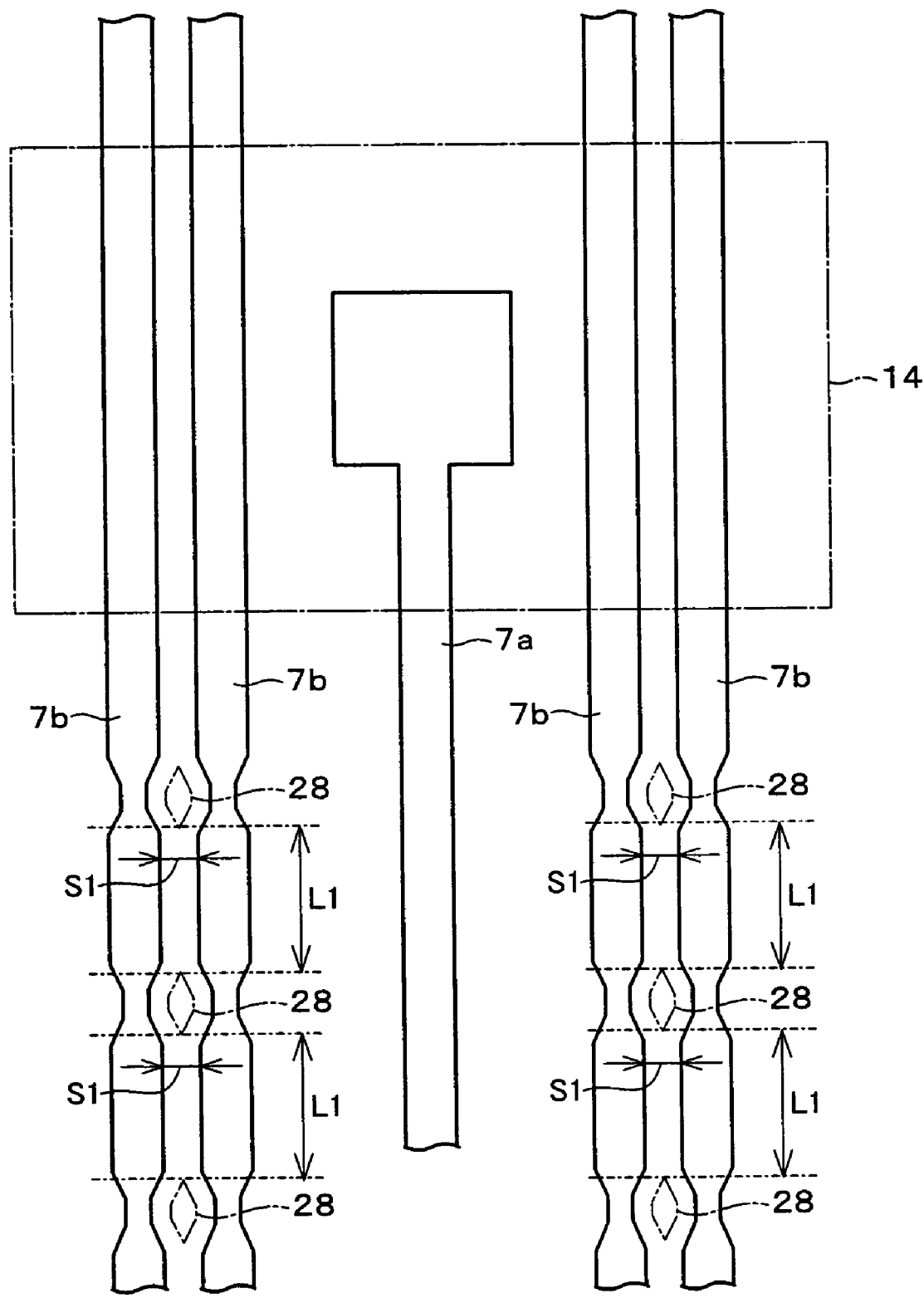
FIG. 22 is a plan view diagrammatically showing another example of a wiring pattern of wires in the semiconductor integrated circuit.

In the wiring pattern shown in FIG. 22, adjacent second wires 7 each has portions of constriction that are formed at a predetermined period in the lengthwise direction. At the portions of constriction, the distance between the second wires 7b is wide, the protective film 8 does not form a bridge, and the void opening 28 is formed.

Thus, by suitably adjusting the period of constrictions in the lengthwise direction, and the distance between non-constriction portions of adjacent second wires 7b, the second wires 7b can satisfy the foregoing conditions. For example, when the period of constrictions in the lengthwise direction is 400 $\mu$m, in which case the length L1 of the bridge is also 400 $\mu$m, scattering of the resist material and swelling of the photoresist layers 40 and 42 can be prevented. As a result, there will be no adverse effect on the fabrication of the semiconductor device.

Figure 23:
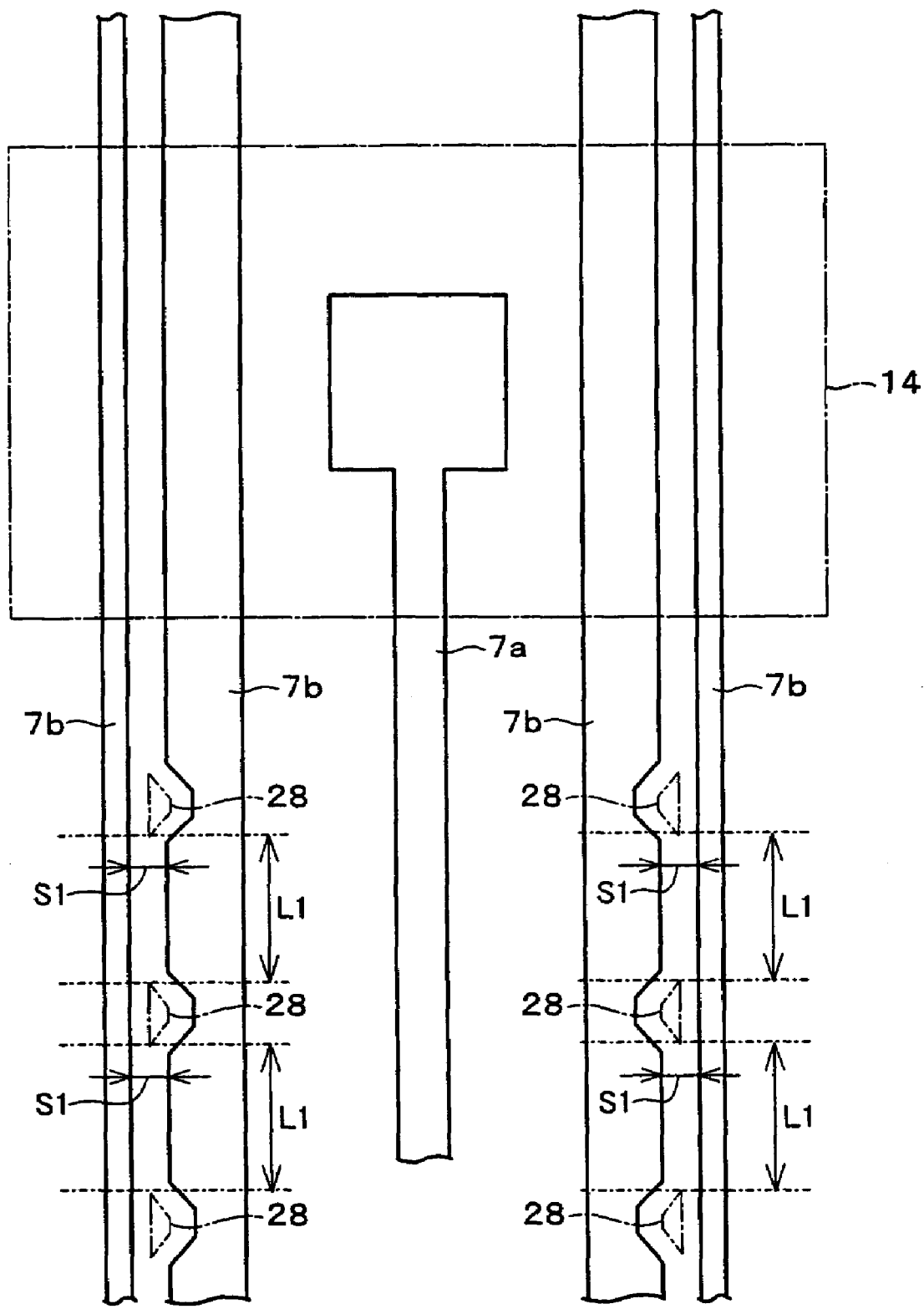
FIG. 23 is a plan view diagrammatically showing yet another example of a wiring pattern of wires in the semiconductor integrated circuit.

In the wiring pattern shown in FIG. 23, one of two adjacent second wires 7b has portions of constriction that are formed at a predetermined period in the lengthwise direction, facing the other second wire 7b. In this case, the distance between the second wires 7 is wide at the portions of constriction, and the void opening 28 is formed therein. In this manner, only one of two adjacent second wires 7b may have portions of constriction, and the constrictions may be formed only on one side of the second wire 7 facing the other second wire 7.

Figure 24:
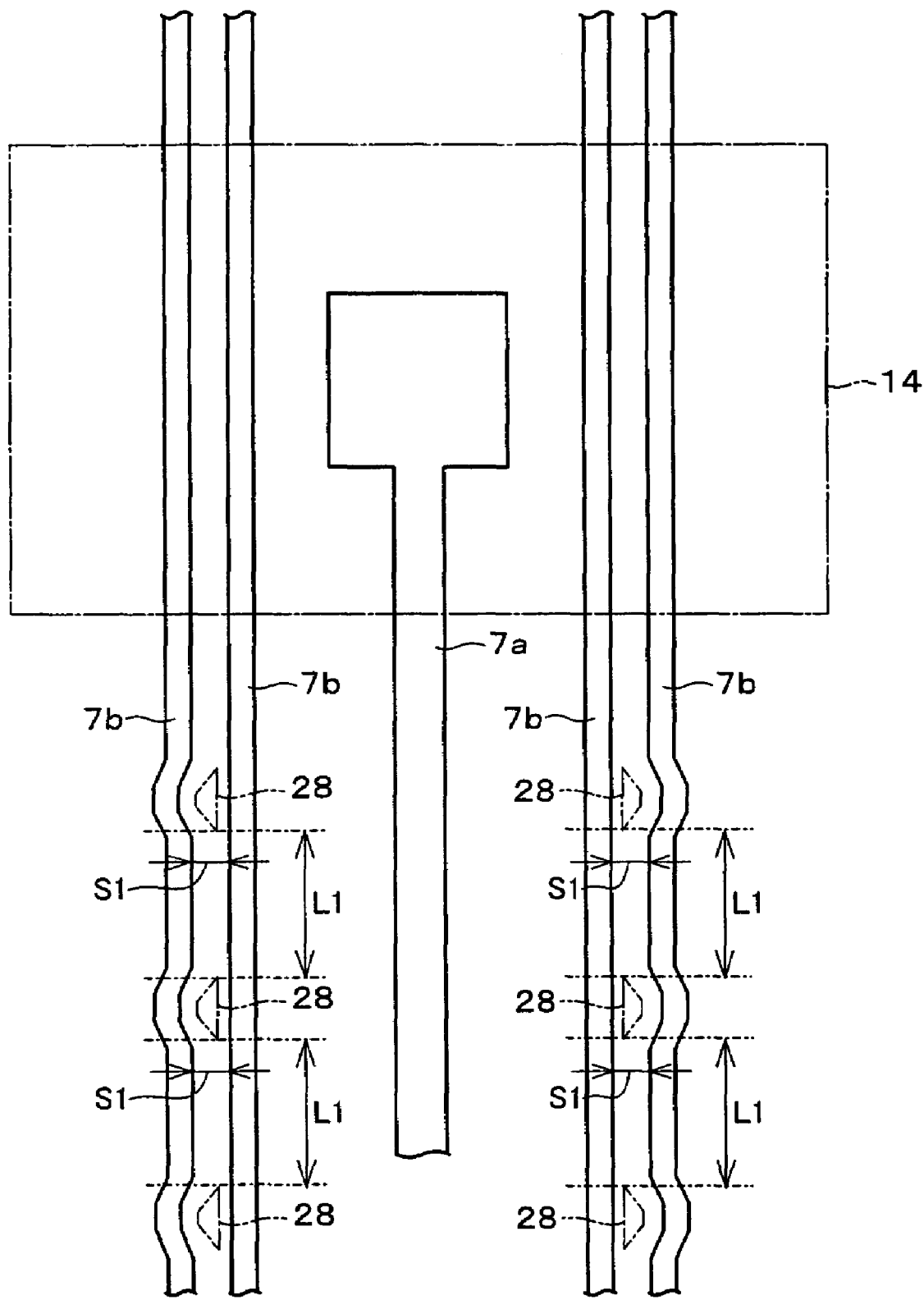
FIG. 24 is a plan view diagrammatically showing still another example of a wiring pattern of wires in the semiconductor integrated circuit.

In the wiring pattern shown in FIG. 24, one of two adjacent second wires 7b has bent portions that are formed at a predetermined period in the lengthwise direction, the bent portions curving outwardly with respect to the other second wire 7b. In this case, the void opening 28 is formed at the bent portions where the distance between the adjacent second wires 7 is wide.

Thus, by suitably adjusting a period of the bent portions in the lengthwise direction, and the distance between non-bent portions of adjacent second wires 7b, the second wires 7b can satisfy the foregoing conditions. Note that, as in the foregoing structures, both of the adjacent second wires 7b may have bent portions that are formed at a predetermined period in the lengthwise direction, curving outwardly from each other.

Figure 13:
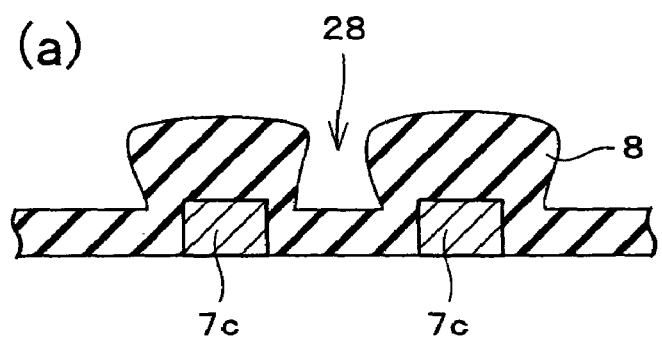
FIG. 13(*a*) is a cross sectional view showing how the protective film is formed on the wires illustrated in FIG. 12, taken along the line A–A' of FIG. 12.
Figure 13:
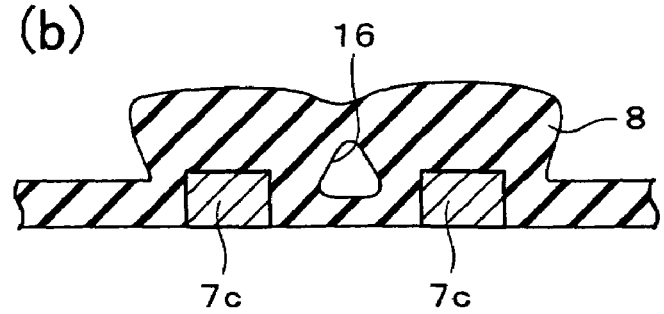
Figure 25:
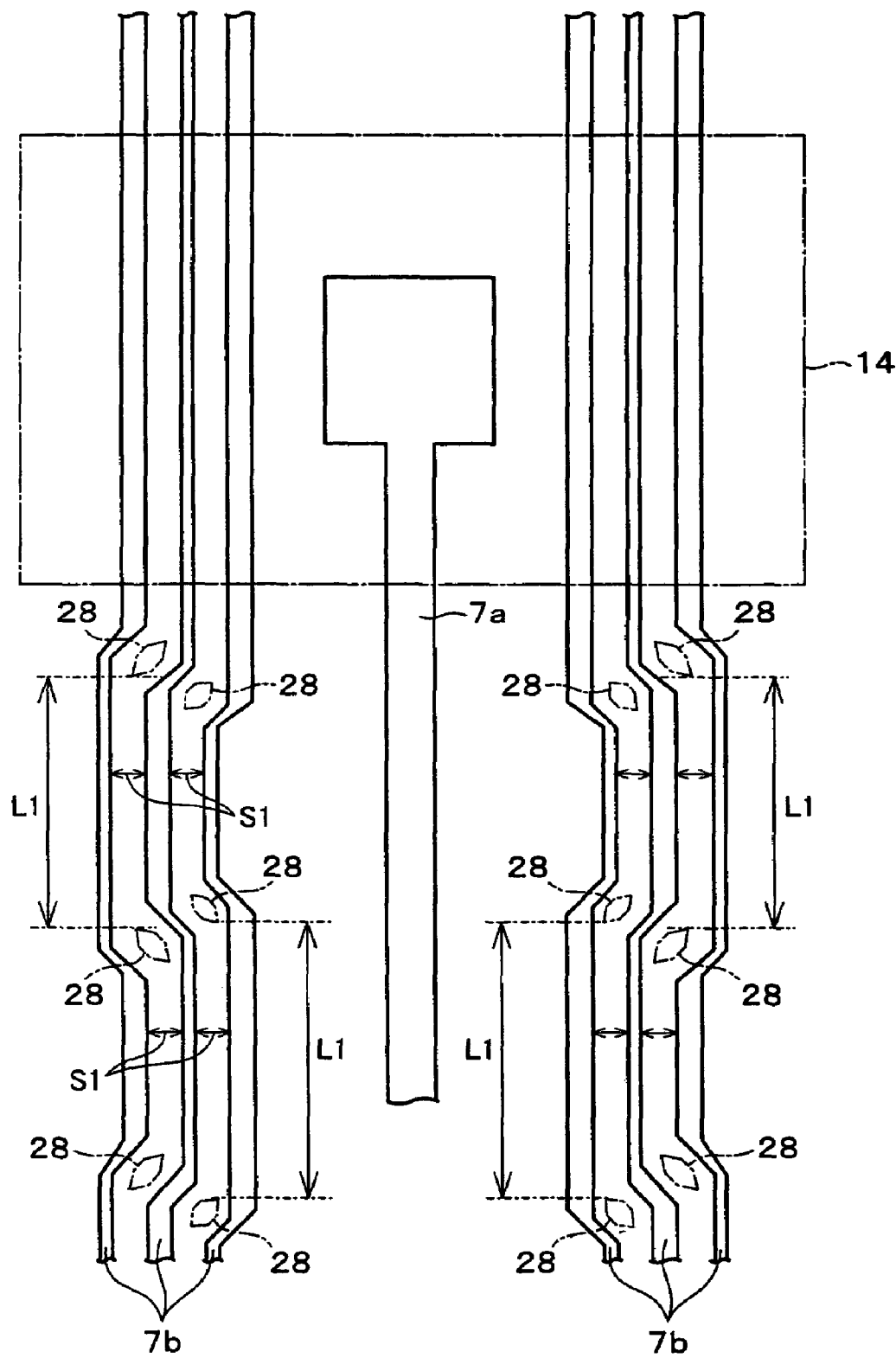
FIG. 25 is a plan view diagrammatically showing yet another example of a wiring pattern of wires in the semiconductor integrated circuit.

In the wiring pattern shown in FIG. 25, all of three adjacent second wires 7b have offset portions that are shifted toward one side at a predetermined period in the lengthwise direction. In this case, as shown in FIG. 12 and FIGS. 13($a$) and 13($b$), the distance between two adjacent second wires 7b is wide at the bent portions offset from the original position, and the void opening 28 is formed therein.

Thus, by suitably adjusting a period of the offset portions in the lengthwise direction, and the distance between two adjacent wires 7b, the second wires 7b can satisfy the foregoing conditions.

Note that, as shown in FIG. 25, it is preferable to bend the wires in order, so that the wire distance can be maintained. Further, the wiring patterns shown in FIG. 20, FIG. 22, and FIG. 23 may be applied to the wiring pattern of three or more second wires 7 as shown in FIG. 25.

By thus suitably changing the wiring pattern of the second wires 7 in the semiconductor device of the present embodiment, the photoresist layers 40 and 42 are prevented from being swelled by the stream of air vesicles from the void 16, thereby suppressing the adverse effect of the void 16 on the fabrication of the semiconductor device when the void 16 is in communication with outside.

Further, by suitably changing the wiring pattern of the second wires 7, the resist material is prevented from scattering out of the void 16. As a result, it is possible to prevent the adverse effect of the void 16 on the fabrication of the semiconductor device when the void 16 is in communication with outside.

Further, because the insulating films 15 and 30 covering the protective film 8 are not required, the semiconductor device can be fabricated in simpler steps, improving productivity and reducing costs.

Note that, in the second wires 7b shown in FIG. 22 through FIG. 25, the wiring pattern is not changed in a region where the bonding pad 14 is formed. It should be noted however that the photoresist layer 40 is formed in a region of the bonding pad 14 when photolithography is used in the step of forming the opening 9 through the protective film 8. In this case, scattering of the resist material or spouting of air vesicles from the void 16 may be detrimental to the fabrication of the semiconductor device. Therefore, the wiring pattern of the second wires 7 may be changed also in a region of the bonding pad 14, so as to satisfy the foregoing conditions.

However, it is worthwhile to note that miniaturization of integrated circuits in the last years has reduced the area of the bonding pad 14, and it is now rare that the area of the bonding pad 14 has a side that measures 400 $\mu$m or greater. Accordingly, scattering of the resist material or spouting of air vesicles does not usually occur in the area of the bonding pad 14, even when photolithography is used.

Therefore, in the area of the bonding pad 14, it is not required to change the wiring pattern of the second wires 7 to satisfy the foregoing conditions. This enables the wiring pattern to be formed with less restriction, and improves flexibility of the wiring pattern in terms of design.

It should be appreciated that the present invention is not just limited to the foregoing embodiments, and various modifications are possible within the scope of claims.

For example, the foregoing embodiments described the semiconductor device of an area pad structure in which the bonding pad 14 is formed over the semiconductor element 20. However, the present invention is also applicable to a recent highly-integrated semiconductor integrated circuit of a structure in which the bonding pad is formed over a plurality of fine wires even outside the area of the semiconductor element 20, for example.

As described, a semiconductor device of the present invention is structured so that one of the plurality of wires is connected to the bonding pad, and a protective film with an insulating property is formed between remaining ones of the plurality of wires and the bonding pad, and that the protective film formed on the remaining ones of the plurality of wires is bridged between adjacent ones of the remaining ones of the plurality of wires at least in a region overlapping with the bonding pad.

According to this structure, the protective film on the wires has a bridge structure, which is effective in preventing cracking at a lower portion of the protective film. Further, a void formed underneath the bridged portion serves as an air spring to prevent damage to the structural elements, such as the wires, formed under the protective film. Moreover, because the polyimide film, which serves as a shock absorber, is not required, working efficiency can be improved and chip cost can be reduced.

Further, as described, in the semiconductor device of the present invention according to the foregoing structure, an insulating film is formed between the protective film and the bonding pad, so as to cover the protective film.

The void is generally surrounded by the protective film, and therefore does not communicate with outside. However, depending on designing of the wiring pattern, there may be a portion where the distance between the wires is wide and the protective film does not form a bridge. In this case, the void communicates with outside through the non-bridge portion, with the result that, for example, a resist material may enter the void in subsequent fabrication steps after forming the protective film, or air vesicles may spout out of the void in a heat treatment process. This is detrimental to the fabrication of the semiconductor device.

Thus, in the semiconductor device of the present invention, the insulating film is formed over the protective film. The insulating film covers the non-bridge portion of the protective film, blocking the communication between the void and outside. As a result, the adverse effect on the fabrication of the semiconductor device can be prevented.

As described, in the semiconductor device of the present invention according to the foregoing structure, the insulating film is an oxide film formed by a chemical vapor deposition method.

The oxide film formed by a chemical vapor deposition method is denser than other types of insulating films, for example, such as an SOG film, formed by a coating method, and contains less water. Thus, the amount of water released from the oxide film is small, preventing the adverse effect of released water on the fabrication of the semiconductor device.

Further, as described, in the semiconductor device of the present invention according to the foregoing structure, the oxide film contains at least one of boron and phosphor.

The oxide film containing at least one of boron and phosphor can be formed by an ordinary-pressure chemical vapor deposition method. The ordinary-pressure chemical vapor deposition method has a higher deposition rate than the vacuum chemical vapor deposition method, and therefore is advantageous in terms of mass production and manufacturing cost.

Further, as described, in the semiconductor device of the present invention according to the foregoing structure, in a region where the protective film is bridged, a minimum value S1 of wire distance between adjacent ones of the remaining ones of the plurality of wires, and/or a length L1 of a bridged portion of the protective film are adjusted to suppress scattering and spouting at a void formed by the bridging of the protective film.

With this structure, scattering of a resist material or spouting of air vesicles can be suppressed even when the void is in communication with outside, thus suppressing the adverse effect on the fabrication of the semiconductor device.

It is preferable that the minimum value S1 of wire distance and/or the length L1 of the bridged portion are adjusted so that the minimum value S1 is not less than 1.8 $\mu$m, and the length L1 is not more than 900 $\mu$m, or the minimum value S1 of wire distance and/or the length L1 of the bridged portion are adjusted so that the minimum value S1 is within a range of from not less than 1.2 $\mu$m to less than 1.8 $\mu$m, and the length L1 is not more than 1400 $\mu$m.

It is also preferable that the minimum value S1 of wire distance and/or the length L1 of the bridged portion are adjusted so that the minimum value S1 is not less than 1.8 $\mu$m, or the length L1 of the bridged portion is not more than 400 $\mu$m. In this way, scattering of a resist material or spouting of air vesicles can be suppressed, thus suppressing the adverse effect on the fabrication of the semiconductor device.

Note that, the photoresist layer is not formed in a region overlapping with the bonding pad when photolithography is not used in the step of forming an opening for connecting the wire and the bonding pad. Thus, the foregoing adjustments are not required in the region overlapping with the bonding pad.

However, it is worthwhile to note that miniaturization of integrated circuits in the last years has reduced the area of the region overlapping with the bonding pad, and it is now rare that the overlapping region has a side that measures 400 $\mu$m or greater. Accordingly, scattering of the resist material or spouting of air vesicles does not usually occur in the region overlapping with the bonding pad 14, even when photolithography is used.

Therefore, the adjustments only need to be performed in a region other than the overlapping region with the bonding pad. Because adjustments are not required in a region overlapping with the bonding pad, flexibility of the wiring pattern can be improved in terms of design.

The semiconductor device of the foregoing structure can be effectively used as a semiconductor device of an area pad structure.

As described, in a fabrication process of a semiconductor device of the present invention, the step of forming a conductive layer include a step of forming a plurality of wires, the step of forming an insulating film on a conductive layer includes a step of forming a protective film having an insulating property, and, in the step of forming a protective film, the protective film is formed so that the protective film is bridged between adjacent ones of the wires at least in a region overlapping with the bonding pad.

According to this process, the protective film on the wires has a bridge structure, which is effective in preventing cracking at a lower portion of the protective film. Further, a void formed underneath the bridged portion serves as an air spring to prevent damage to the structural elements, such as the wires, formed under the protective film. Moreover, because the step of forming a polyimide film, which serves as a shock absorber, is not required, working efficiency can be improved and chip cost can be reduced.

Further, as described, in the fabrication process of the semiconductor device of the present invention according to the foregoing process, the step of forming an insulating film on the conductive layer further includes the step of forming another insulating film over the protective film formed in the step of forming a protective film.

With this process, the insulating film covers the non-bridge portion of the protective film, blocking the communication between the void and outside. As a result, the adverse effect on the fabrication of the semiconductor device can be prevented.

As described, in the fabrication process of a semiconductor device of the present invention according to the foregoing structure, in the step of forming another insulating film, the oxide film is formed by a chemical vapor deposition method so as to cover the protective film.

With this process, because the oxide film formed by a chemical vapor deposition method releases only a small amount of water, the adverse effect of released water on the fabrication of the semiconductor device can be prevented.

Further, as described, in the fabrication process of a semiconductor device of the present invention according to the foregoing process, in the step of forming an oxide film, the oxide film contains at least one of boron and phosphor.

The oxide film containing at least one of boron and phosphor can be formed by an ordinary-pressure chemical vapor deposition method. The ordinary-pressure chemical vapor deposition method has a higher deposition rate than the vacuum chemical vapor deposition method, and therefore is advantageous in terms of mass production and manufacturing cost.

Further, as described, in the fabrication process of a semiconductor device of the present invention according to the foregoing process, in a region where the protective film is bridged, a minimum value S1 of wire distance between adjacent ones of the remaining ones of the plurality of wires, and/or a length L1 of a bridged portion of the protective film are adjusted to suppress scattering and spouting at a void formed by the bridging of the protective film.

With this process, scattering of a resist material or spouting of air vesicles can be suppressed even when the void is in communication with outside, thus suppressing the adverse effect on the fabrication of the semiconductor device.

It is preferable that the minimum value S1 of wire distance and/or the length L1 of the bridged portion are adjusted so that the minimum value S1 is not less than 1.8 $\mu$m, and the length L1 is not more than 900 $\mu$m, or the minimum value S1 of wire distance and/or the length L1 of the bridged portion are adjusted so that the minimum value S1 is within a range of from not less than 1.2 $\mu$m to less than 1.8 $\mu$m, and the length L1 is not more than 1400 $\mu$m.

It is also preferable that the minimum value S1 of wire distance and/or the length L1 of the bridged portion are adjusted so that the minimum value S1 is not less than 1.8 $\mu$m, or the length L1 of the bridged portion is not more than 400 $\mu$m. In this way, scattering of a resist material or spouting of air vesicles can be suppressed, thus suppressing the adverse effect on the fabrication of the semiconductor device.

Note that, the photoresist layer is not formed in a region overlapping with the bonding pad when photolithography is not used in the step of forming an opening for connecting the wire and the bonding pad. Thus, the foregoing adjustments are not required in the region overlapping with the bonding pad.

However, it is worthwhile to note that miniaturization of integrated circuits in the last years has reduced the area of the region overlapping with the bonding pad, and it is now rare that the overlapping region has a side that measures 400 $\mu$m or greater. Accordingly, scattering of the resist material or spouting of air vesicles does not usually occur in the region overlapping with the bonding pad 14, even when photolithography is used.

Therefore, the adjustments only need to be performed in a region other than the overlapping region with the bonding pad. Because adjustments are not required in a region overlapping with the bonding pad, flexibility of the wiring pattern can be improved in terms of design.

The fabrication process of a semiconductor device can be effectively used as a fabrication process of a semiconductor device of an area pad structure.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a conductive layer with a plurality of wires; and
   a bonding pad formed in a region overlapping the plurality of wires,
   wherein:
   one of the plurality of wires is connected to the bonding pad, and a protective film with an insulating property is formed between remaining ones of the plurality of wires and the bonding pad; and
   the protective film bridges adjacent ones of said remaining ones of the plurality of wires at least in a region overlapping with the bonding pad so that a void is formed in the protective film between the adjacent ones of said remaining ones of the plurality of wires.

2. The semiconductor device as set forth in claim 1, wherein an insulating film is formed between the protective film and the bonding pad, so as to cover the protective film.

3. The semiconductor device as set forth in claim 2, wherein the insulating film is an oxide film formed by a chemical vapor deposition method.

4. The semiconductor device as set forth in claim 3, wherein the oxide film contains at least one of boron and phosphor.

5. The semiconductor device as set forth in claim 1,
   wherein the conductive layer comprises a second wiring layer that is formed on a semiconductor substrate having an active region where a semiconductor element is formed, and on a first wiring layer, via an interlayer insulating film, that is electrically connected to the active region, and
   wherein the bonding pad is formed to overlap at least partially with the active region.

6. The semiconductor device of claim 1, wherein a void is formed in the protective film at least between adjacent first and second of the remaining ones of the plurality of wires in a region overlapping with the bonding pad.

7. A semiconductor device comprising:
   a conductive layer with a plurality of wires; and
   a bonding pad formed in a region overlapping with the plurality of wires of the conductive layer,
   wherein:
   at least one of the plurality of wires is connected to the bonding pad, and a protective film with an insulating property is formed between remaining ones of the plurality of wires and the bonding pads;
   the protective film formed on said remaining ones of the plurality of wires is bridged between adjacent ones of said remaining ones of the plurality of wires at least in a region overlapping with the bonding pad; and
   in a region where the protective film is bridged, a minimum value S1 of wire distance between adjacent ones of said remaining ones of the plurality of wires, and/or a length L1 of a bridged portion of the protective film are adjusted to suppress scattering and spouting at a void formed by the bridging of the protective film.

8. The semiconductor device as set forth in claim 7, wherein the minimum value S1 of wire distance and/or the length L1 of the bridged portion are adjusted so that the minimum value S1 is not less than 1.8 $\mu$m, and the length L1 is not more than 900 $\mu$m, or the minimum value S1 of wire distance and/or the length L1 of the bridged portion are adjusted so that the minimum value S1 is within a range of from not less than 1.2 $\mu$m to less than 1.8 $\mu$m, and the length L1 is not more than 1400 $\mu$m.

9. The semiconductor device as set forth in claim 8, wherein the minimum value S1 of wire distance and/or the length L1 of the bridged portion are adjusted so that the minimum value S1 is not less than 1.8 μm, or the length L1 of the bridged portion is not more than 400 μm.

10. The semiconductor device as set forth in claim 7, wherein the minimum value S1 and/or the length L1 are adjusted in a region other than the region overlapping with the bonding pad.

11. A semiconductor device comprising:

a conductive layer with a plurality of wires; and a bonding pad formed in a region at least partially overlapping with the plurality of wires of the conductive layer, wherein:

at least one of the plurality of wires is connected to the bonding pad, and a protective film with an insulating property is formed between remaining ones of the plurality of wires and the bonding pad; and the protective film formed on said remaining ones of the plurality of wires is bridged between adjacent ones of said remaining ones of the plurality of wires at least in a region overlapping with the bonding pad so that a void is formed in the protective film at least between adjacent first and second of the remaining ones of the plurality of wires at least in a region overlapping with the bonding pad.

* * * * *